(12) United States Patent
Oh et al.

(10) Patent No.: US 10,121,543 B2
(45) Date of Patent: Nov. 6, 2018

(54) STORAGE DEVICE INCLUDING A NONVOLATILE MEMORY DEVICE AND A CONTROLLER FOR CONTROLLING A WRITE OPERATION OF THE NONVOLATILE MEMORY DEVICE AND AN OPERATING METHOD OF THE STORAGE DEVICE

(71) Applicant: SAMSUNG ELECTRONICS CO., LTD., Suwon-si, Gyeonggi-do (KR)

(72) Inventors: Eun Chu Oh, Hwaseong-si (KR); Jun Jin Kong, Yongin-si (KR); Hong Rak Son, Anyang-si (KR); Pilsang Yoon, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 10 days.

(21) Appl. No.: 15/092,108

(22) Filed: Apr. 6, 2016

(65) Prior Publication Data

US 2017/0052732 A1 Feb. 23, 2017

(30) Foreign Application Priority Data

Aug. 21, 2015 (KR) ........................ 10-2015-0118119

(51) Int. Cl.
| | |
|---|---|
| *G06F 12/00* | (2006.01) |
| *G11C 16/10* | (2006.01) |
| *G11C 11/56* | (2006.01) |
| *G11C 16/32* | (2006.01) |
| *G11C 16/34* | (2006.01) |

(52) U.S. Cl.
CPC .............. *G11C 16/10* (2013.01); *G06F 12/00* (2013.01); *G11C 11/5628* (2013.01); *G11C 16/32* (2013.01); *G11C 16/3459* (2013.01); *G11C 2211/5622* (2013.01)

(58) Field of Classification Search
CPC ........................................................ G06F 12/00
USPC ........................................................ 711/154
See application file for complete search history.

(56) References Cited

U.S. PATENT DOCUMENTS

| | | |
|---|---|---|
| 7,679,133 B2 | 3/2010 | Son et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,958,251 B2 | 2/2015 | Kwon et al. |

(Continued)

FOREIGN PATENT DOCUMENTS

| | | |
|---|---|---|
| KR | 1020130050589 | 5/2013 |
| KR | 1020130142408 | 12/2013 |

(Continued)

*Primary Examiner* — Gautam Sain
(74) *Attorney, Agent, or Firm* — F. Chau & Associates, LLC

(57) ABSTRACT

A storage device includes a nonvolatile memory device including a plurality of memory cells, the memory cells divided into a plurality of pages, and a controller configured to control the nonvolatile memory device. The storage device is configured to collect two or more write data groups to be written to two or more pages, to simultaneously perform a common write operation with the two or more pages based on the two or more write data groups, and to sequentially perform an individual write operation with each of the two or more pages based on the two or more write data groups.

20 Claims, 20 Drawing Sheets

(56) References Cited

U.S. PATENT DOCUMENTS

| | | | |
|---|---|---|---|
| 9,147,471 B2 | 9/2015 | Lee | |
| 9,269,445 B1 * | 2/2016 | Abe | G11C 16/10 |
| 2011/0157998 A1 * | 6/2011 | Yang | G11C 16/10 |
| | | | 365/185.22 |
| 2011/0233648 A1 | 9/2011 | Seol et al. | |
| 2011/0292724 A1 * | 12/2011 | Kim | G11C 16/0483 |
| | | | 365/185.03 |
| 2013/0250677 A1 * | 9/2013 | Nam | G11C 13/0002 |
| | | | 365/185.03 |
| 2014/0047163 A1 * | 2/2014 | Kwak | G06F 12/0246 |
| | | | 711/103 |
| 2014/0219025 A1 * | 8/2014 | Kang | G11C 16/10 |
| | | | 365/185.11 |
| 2015/0003151 A1 | 1/2015 | Lee | |
| 2015/0003152 A1 * | 1/2015 | Kwak | G11C 11/5628 |
| | | | 365/185.03 |
| 2016/0070488 A1 * | 3/2016 | Shaharabany | G06F 3/0611 |
| | | | 711/103 |

FOREIGN PATENT DOCUMENTS

| | | |
|---|---|---|
| KR | 1020140020445 | 2/2014 |
| KR | 1020140100143 | 8/2014 |
| KR | 1020150003969 | 1/2015 |

\* cited by examiner

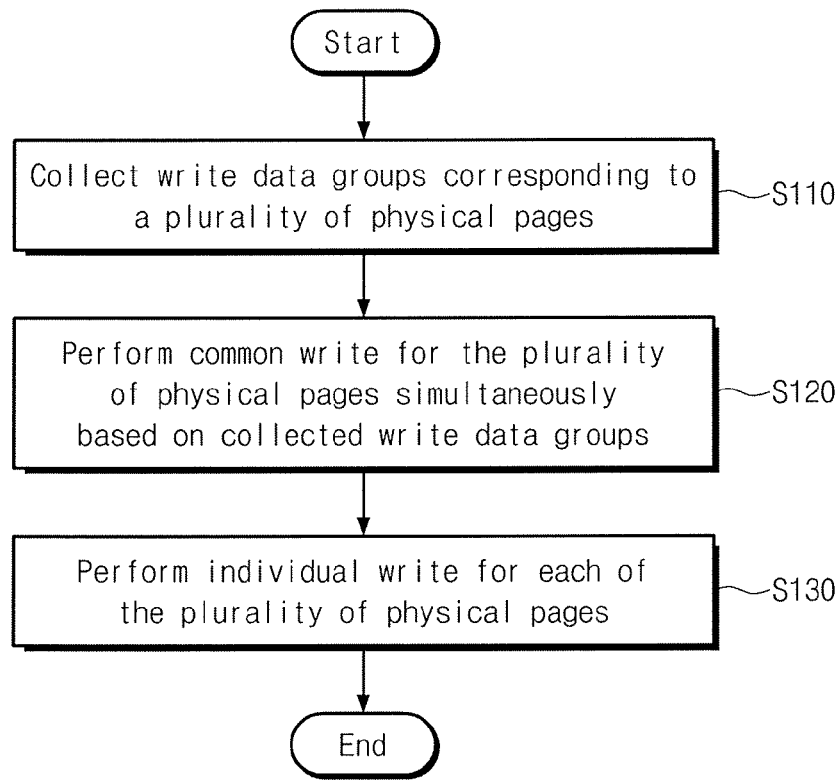
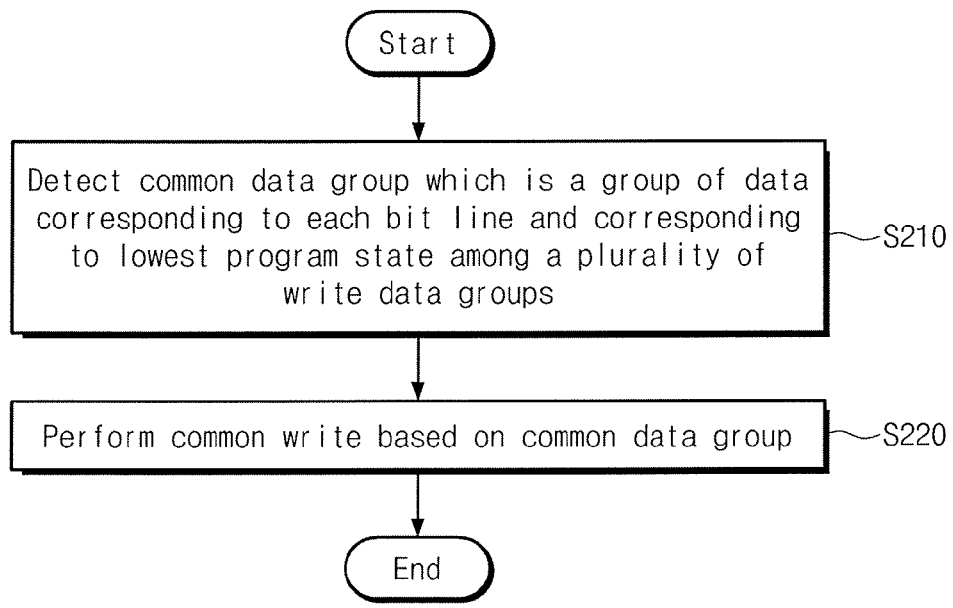

FIG. 8

|  | Program Operation | Verification Operation |
|---|---|---|
| BL2 | VALW | VPRE |
| BL1 | VIHB | |
| SSL2b | VON | VON |
| SSL2a | | |
| SSL1b | | |
| SSL1a | | |
| WL6 | VPASS | VREAD |
| WL5 | | |
| WL4 | | |
| WL3 | | |
| WL2 | VPGM | VFY |
| WL1 | VPASS | VREAD |
| GSL2 | VOFF | VON |
| GSL1 | | |

FIG. 9

| | Program Operation | 1st Verification Operation | 2nd Verification Operation |
|---|---|---|---|
| BL2 | VALW | VPRE | VPRE |
| BL1 | VIHB | | |
| SSL2b | VON | VOFF | VON |
| SSL2a | | | |
| SSL1b | | VON | VOFF |
| SSL1a | | | |
| WL6 | VPASS | VREAD | VREAD |
| WL5 | | | |
| WL4 | | | |
| WL3 | | | |
| WL2 | VPGM | VFY | VFY |
| WL1 | VPASS | VREAD | VREAD |
| GSL2 | VOFF | VON | VON |
| GSL1 | | | |

STORAGE DEVICE INCLUDING A NONVOLATILE MEMORY DEVICE AND A CONTROLLER FOR CONTROLLING A WRITE OPERATION OF THE NONVOLATILE MEMORY DEVICE AND AN OPERATING METHOD OF THE STORAGE DEVICE

CROSS-REFERENCE TO RELATED APPLICATION

This application claims priority under 35 U.S.C. § 119 to Korean Patent Application No. 10-2015-0118119 filed Aug. 21, 2015, in the Korean Intellectual Property Office, the disclosure of which is incorporated by reference herein in its entirety.

TECHNICAL FIELD

The inventive concept relates to a semiconductor memory, and in particular, to a storage device including a nonvolatile memory device, a controller for controlling a write operation of the nonvolatile memory device and an operating method of the storage device.

DISCUSSION OF RELATED ART

A storage device stores data under control of a host device such as a computer, a smart phone, a smart pad, or the like. The storage device may store data on a magnetic disk, such as a hard disk drive (HDD), or may store data on a semiconductor memory, such as a solid state drive (SSD), a memory card, or the like. The SSD and memory card may be nonvolatile memories.

The nonvolatile memory includes a read only memory (ROM), a programmable ROM (PROM), an electrically programmable ROM (EPROM), an electrically erasable and programmable ROM (EEPROM), a flash memory device, a random access memory (RAM), a phase-change RAM (PRAM), a magnetic RAM (MRAM), a resistive RAM (RRAM), a ferroelectric RAM (FRAM), or the like.

The degree of integration of the storage device and a volume thereof continue to increase as semiconductor manufacturing technologies develop. The high degree of integration of the storage device makes it possible to reduce a manufacturing cost of the storage device. However, the high degree of integration of the storage device can lower the reliability of the storage device.

SUMMARY

An exemplary embodiment of the inventive concept provides a storage device including a nonvolatile memory device comprising a plurality of memory cells, the memory cells divided into a plurality of pages, and a controller configured to control the nonvolatile memory device. The storage device is configured to collect two or more write data groups to be written to two or more pages, to simultaneously perform a common write operation with the two or more pages based on the two or more write data groups, and to sequentially perform an individual write operation with each of the two or more pages based on the two or more write data groups.

Memory cells which are disposed between a string selection line and a ground selection line, are connected in common to a word line, and correspond to a plurality of bit lines constitute a page.

The controller is configured to detect a common data group from the two or more write data groups and to perform the common write operation based on the detected common data group, and the common data group includes data, which corresponds to respective bit lines and corresponds to a lowest voltage distribution range, from among the two or more write data groups.

The controller transmits the detected common data group to the nonvolatile memory device and controls the nonvolatile memory device such that the detected common data group is simultaneously written to the two or more pages.

The nonvolatile memory device is configured to perform the common write operation by performing a program loop plural times with the two or more pages, and the program loop comprises a program operation in which a program voltage is applied to the two or more pages and a verification operation in which a verification voltage is applied to the two or more pages.

The nonvolatile memory device is configured to perform the program operation simultaneously with the two or more pages, and the nonvolatile memory device is configured to perform the verification operation simultaneously with the two or more pages.

The nonvolatile memory device is configured to perform the program operation simultaneously with the two or more pages, and the nonvolatile memory device is configured to perform the verification operation sequentially with the two or more pages.

The nonvolatile memory device is configured to reduce a level of the verification voltage to be lower than a predetermined value during the common write operation.

The nonvolatile memory device is configured to increase the program voltage to be lower than a predetermined value when the program loop is repeated, during the common write operation.

The nonvolatile memory device is configured to complete the common write operation when a result of the verification operation indicates a pass and to complete the common write operation if the program loop is performed a predetermined number of times.

When the lowest voltage distribution range is higher than a reference voltage distribution range, the controller is configured to detect, as the common data group, data corresponding to the reference voltage distribution range.

The memory cells are included in a plurality of cell strings arranged on a substrate, and each of the cell strings comprises a ground selection transistor, memory cells, and a string selection transistor stacked in a direction perpendicular to the substrate.

Memory cells which are disposed between a string selection line and a ground selection line, are connected in common to a word line, correspond to a plurality of bit lines, and are disposed at a same height from the substrate constitute a page.

The two or more pages are disposed at a same height from the substrate.

The two or more pages are disposed at different heights from the substrate.

The controller performs the common write operation with respect to first pages among pages disposed at a same height from the substrate and controls the nonvolatile memory device such that the individual write operation is performed with respect to each of the first pages, and the controller performs the common write operation with respect to second pages among pages disposed at the same height from the substrate and controls the nonvolatile memory device such that the individual write operation is performed with respect to each of the second pages.

During the individual write operation, the controller transmits a first write data group among the two or more write data groups to the nonvolatile memory device, controls the nonvolatile memory device such that the first write data group is written to a first page among the two or more pages, transmits a second write data group among the two or more write data groups to the nonvolatile memory device, and controls the nonvolatile memory device such that the second write data group is written to a second page among the two or more pages.

The storage device further comprises a random access memory, and the memory controller is configured to collect the two or more write data groups in the random access memory.

An exemplary embodiment of the inventive concept provides a storage device including a random access memory, a nonvolatile memory device comprising a plurality of cell strings arranged on a substrate, each of the cell strings comprising a ground selection transistor, memory cells, and a string selection transistor stacked in a direction perpendicular to the substrate, and a controller configured to simultaneously perform a common write operation with a plurality of pages of the nonvolatile memory device using data collected on the random access memory and control the nonvolatile memory device such that an individual write operation is sequentially performed with each of the plurality pages. In the nonvolatile memory device, memory cells which are disposed between a string selection line and a ground selection line, are connected in common to a word line, correspond to a plurality of bit lines, and are disposed at a same height from the substrate constitute a page.

An exemplary embodiment of the inventive concept provides an operating method of a storage device which comprises a nonvolatile memory device and a controller configured to control the nonvolatile memory device, the method including collecting a first data group and a second data group, by the controller, transmitting to the nonvolatile memory device a third data group generated from the first data group and the second data group, by the controller, simultaneously performing a common write operation with first and second pages using the third data group, by the nonvolatile memory device, transmitting the first data group to the nonvolatile memory device, by the controller, performing an individual write operation with the first page using the first data group, by the nonvolatile memory device, transmitting the second data group to the nonvolatile memory device, by the controller, and performing an individual write operation with the second page using the second data group, by the nonvolatile memory device.

An exemplary embodiment of the inventive concept provides a storage device comprising: a nonvolatile memory device including a plurality pages, each page including a plurality of memory cells; and a memory controller configured to transmit a common data group to the nonvolatile memory device and instruct the nonvolatile memory device to write the common data group to first and second pages, to transmit a first data group to the nonvolatile memory device and instruct the nonvolatile memory device to write the first data group to the first page, and to transmit a second data group to the nonvolatile memory device and instruct the nonvolatile memory device to write the second data group to the second page.

The memory cells are vertically stacked between at least one string select transistor and at least one ground select transistor on a substrate.

The common data group has a lowest program state from among the first and second data groups.

BRIEF DESCRIPTION OF THE DRAWINGS

The above and other features of the inventive concept will become more apparent by describing in detail exemplary embodiments thereof with reference to the accompanying drawings, in which:

FIG. 4 is a flow chart illustrating an operating method of a storage device according to an exemplary embodiment of the inventive concept;

FIG. 5 is a flow chart illustrating a procedure for performing a common write operation, according to an exemplary embodiment of the inventive concept;

FIG. 8 illustrates performing a program operation and a verification operation of FIG. 7 in accordance with an exemplary embodiment of the inventive concept;

FIG. 9 illustrates performing a program operation and a verification operation of FIG. 7 in accordance with an exemplary embodiment of the inventive concept;

DETAILED DESCRIPTION OF THE EMBODIMENTS

Below, exemplary embodiments of the inventive concept will be described more fully with reference to the accompanying drawings. The inventive concept may, however, be embodied in many different forms and should not be construed as limited to the exemplary embodiments set forth herein.

Herein, a "page" may refer to a group of a plurality of memory cells. The page may be determined according to a location relationship between memory cells of a nonvolatile memory device. For example, the page may include memory cells which are disposed between a string selection line and a ground selection line, are connected in common to a word line, and correspond to a plurality of bit lines. A "data group" may refer to a group of pieces of data to be written to memory cells included in a page.

Figure 1:
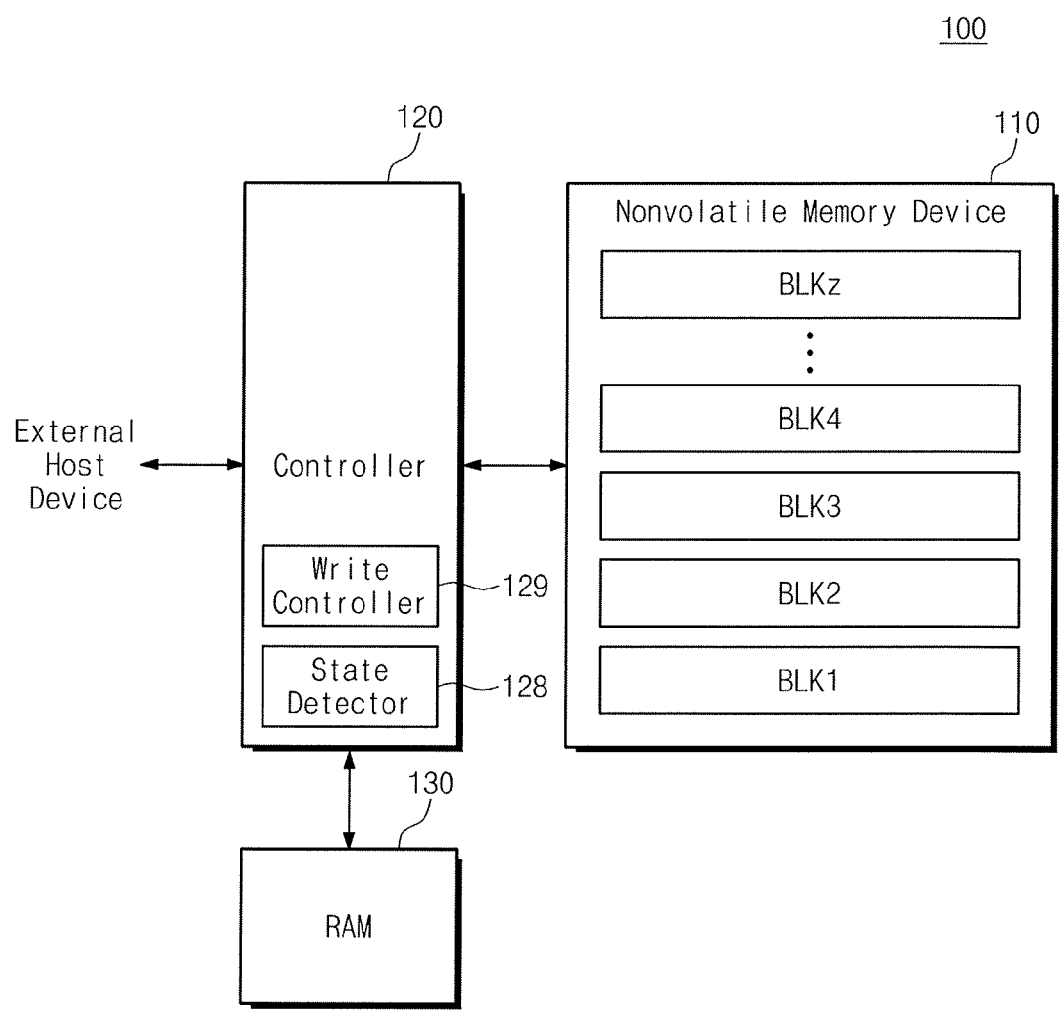
FIG. 1 is a block diagram illustrating a storage device according to an exemplary embodiment of the inventive concept.

FIG. 1 is a block diagram illustrating a storage device 100 according to an exemplary embodiment of the inventive concept. Referring to FIG. 1, the storage device 100 may include a nonvolatile memory device 110, a controller 120, and a random access memory (RAM) 130.

The nonvolatile memory device 110 may include a plurality of memory blocks BLK1 to BLKz. The nonvolatile memory device 110 may perform writing, reading and erasing under control of the controller 120.

The controller 120 may be configured to control the nonvolatile memory device 110 and the RAM 130. For example, the controller 120 may collect write data groups, received from an external host device, on the RAM 130 and may write the write data groups collected on the RAM 130 to the nonvolatile memory device 110.

The controller 120 may include a state detector 128 and a write controller 129. The state detector 128 may detect a common data group from write data groups collected on the RAM 130. The write controller 129 may control the nonvolatile memory device 110 to perform a common write operation using the detected common data group. Further, the write controller 129 may control the nonvolatile memory device 110 to perform individual write operations using the write data groups collected on the RAM 130. A write operation of the storage device 100 which is based on the state detector 128 and the write controller 129 will be described later.

Figure 2:
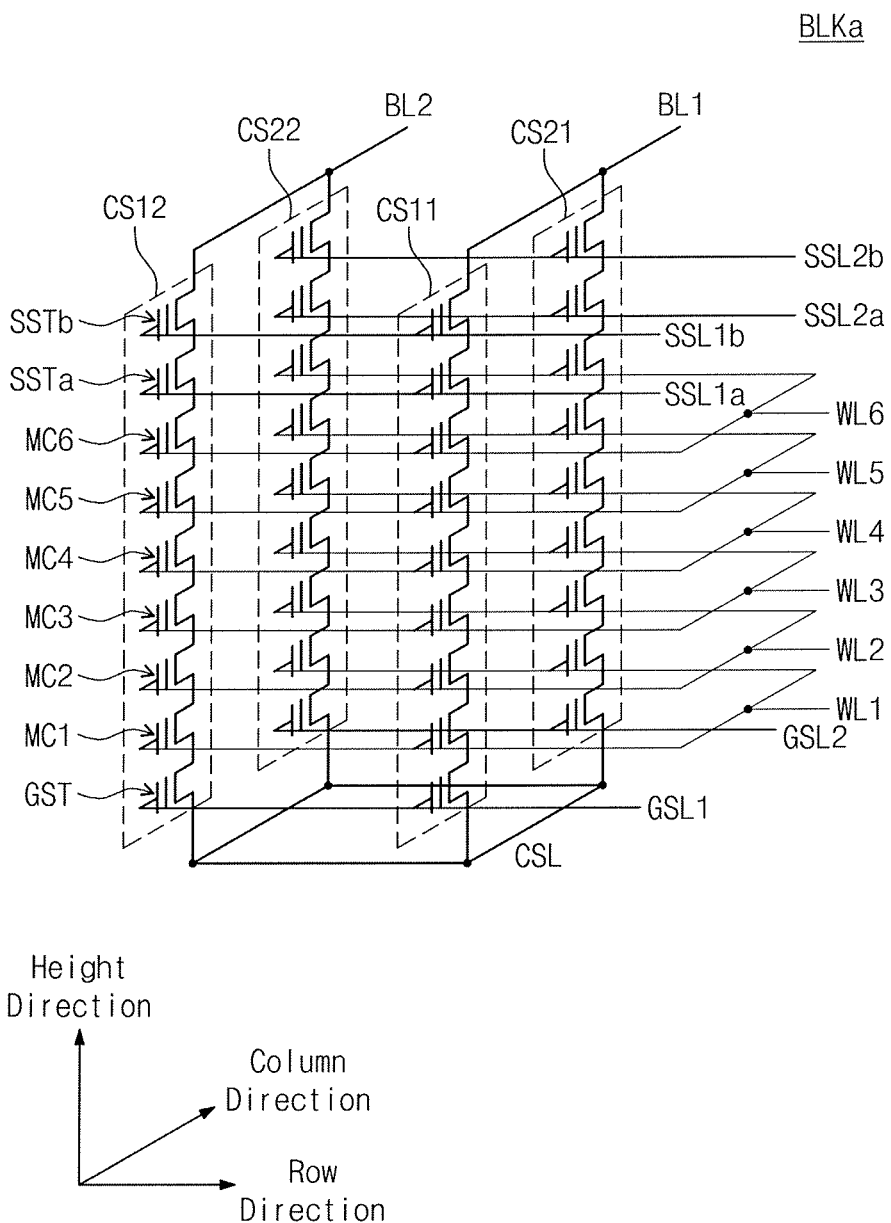
FIG. 2 is a circuit diagram illustrating a memory block according to an exemplary embodiment of the inventive concept.

FIG. 2 is a circuit diagram illustrating a memory block BLKa according to an exemplary embodiment of the inventive concept. Referring to FIG. 2, the memory block BLKa may include a plurality of cell strings CS11 to CS21 and CS12 to CS22. The plurality of cell strings CS11 to CS21 and CS12 to CS22 may be arranged in a matrix of rows and columns.

For example, the cell strings CS11 and CS12 arranged along a row direction may constitute a first row, and the cell strings CS21 and CS22 arranged along the row direction may constitute a second row. The cell strings CS11 and CS21 arranged along a column direction may constitute a first column, and the cell strings CS12 and CS22 arranged along the column direction may constitute a second column.

Each cell string may contain a plurality of cell transistors. The cell transistors may include ground selection transistors GST, memory cells MC1 through MC6, and string selection transistors SSTa and SSTb. The ground selection transistors GST, memory cells MC1 through MC6, and string selection transistors SSTa and SSTb in each cell string may be stacked in a height direction perpendicular to a plane (e.g., a plane on a substrate of the memory block BLKa) on which the cell strings CS11 to CS21 and CS12 to CS22 are arranged along the rows and the columns.

Each cell transistor may be a charge trap type cell transistor whose threshold voltage changes according to the amount of charges trapped in an insulating layer thereof.

Lowermost ground selection transistors GST may be connected in common to a common source line CSL.

Control gates of the ground selection transistors GST of the cell strings CS11 to CS21 and CS12 to CS22 may be connected to ground selection lines GSL1 and GSL2, respectively. In an exemplary embodiment of the inventive concept, ground selection transistors in the same row may be connected to the same ground selection line, and ground selection transistors of different rows may be connected to different ground selection lines. For example, the ground selection transistors GST of the cell strings CS11 and CS12 in the first row may be connected to the first ground selection line GSL1, and the ground selection transistors GST of the cell strings CS21 and CS22 in the second row may be connected to the second ground selection line GSL2.

Connected in common to a word line are control gates of memory cells that are placed at the same height (or, order) from the substrate (or, the ground selection transistors GST). Connected to different word lines WL1 to WL6 are control gates of memory cells that are placed at different heights (or, orders). For example, the memory cells MC1 may be connected in common to the word line WL1. The memory cells MC2 may be connected in common to the word line WL2. The memory cells MC3 may be connected in common to the word line WL3. The memory cells MC4 may be connected in common to the word line WL4. The memory cells MC5 may be connected in common to the word line WL5. The memory cells MC6 may be connected in common to the word line WL6.

In first string selection transistors SSTa, having the same height (or, order), of the cell strings CS11 to CS21 and CS12 to CS22, control gates of the first string selection transistors SSTa in different rows may be connected to different string selection lines SSL1a and SSL2a, respectively. For example, the first string selection transistors SSTa of the cell strings CS11 and CS12 may be connected in common to the string selection line SSL1a. The first string selection transistors SSTa of the cell strings CS21 and CS22 may be connected in common to the string selection line SSL2a.

In second string selection transistors SSTb, having the same height (or, order), of the cell strings CS11 to CS21 and CS12 to CS22, control gates of the second string selection transistors SSTb in different rows may be connected to the different string selection lines SSL1b and SSL2b. For example, the second string selection transistors SSTb of the cell strings CS11 and CS12 may be connected in common to the string selection line SSL1b. The second string selection transistors SSTb of the cell strings CS21 and CS22 may be connected in common to the string selection line SSL2b.

In other words, cell strings in different rows may be connected to different string selection lines. String selection transistors, having the same height (or, order), of cell strings in the same row may be connected to the same string selection line. String selection transistors, having different heights (or, orders), of cell strings in the same row may be connected to different string selection lines.

In an exemplary embodiment of the inventive concept, string selection transistors of cell strings in the same row may be connected in common to a string selection line. For example, the string selection transistors SSTa and SSTb of the cell strings CS11 and CS12 in a first row may be connected in common to a string selection line. The string selection transistors SSTa and SSTb of the cell strings CS21 and CS22 in a second row may be connected in common to a string selection line.

Columns of the cell strings CS11 through CS21 and CS12 through CS22 may be connected to different bit lines BL1 and BL2, respectively. For example, the string selection transistors SSTb of the cell strings CS11 and CS21 may be connected in common to the bit line BL1. The string selection transistors SSTb of the cell strings CS12 and CS22 may be connected in common to the bit line BL2.

The cell strings CS11 and CS12 may constitute a first plane. The cell strings CS21 and CS22 may constitute a second plane.

Memory cells which are disposed between a string selection line and a ground selection line, are connected in common to a word line, and correspond to a plurality of bit lines may constitute a page. For example, in the memory block BLKa, memory cells of each plane which are placed at the same height may compose a physical page. A physical page may be a unit of the memory cells MC1 to MC6 that is written and read. One plane of the memory block BLKa may be selected by the string selection lines SSL1a, SSL1b, SSL2a, and SSL2b. The cell strings CS11 and CS12 in a first plane may be connected to the bit lines BL1 and BL2 when a turn-on voltage is supplied to the string selection lines SSL1a and SSL1b and a turn-off voltage is supplied to the string selection lines SSL2a and SSL2b. In other words, the first plane may be selected. The cell strings CS21 and CS22 in a second plane may be connected to the bit lines BL1 and BL2 when the turn-on voltage is supplied to the string selection lines SSL2a and SSL2b and the turn-off voltage is supplied to the string selection lines SSL1a and SSL1b. In other words, the second plane may be selected. In a selected plane, a row of memory cells MC may be selected by the word lines WL1 to WL6. In the selected row, a selection voltage may be applied to the second word line WL2, and a non-selection voltage may be applied to the rest of the word lines WL1 and WL3 to WL6. In other words, a physical page which corresponds to the second word line WL2 of the second plane may be selected by adjusting voltages on the string selection lines SSL1a, SSL1b, SSL2a, and SSL2b and the word lines WL1 to WL6. A write or read operation may be performed with respect to the memory cells MC2 in the selected physical page.

In the memory block BLKa, the memory cells MC1 to MC6 may be erased by a memory block or by a sub-block. When erasing is performed by the memory block, all memory cells MC in the memory block BLKa may be simultaneously erased according to an erase request (e.g., an erase request from an external memory controller). When erasing is performed by the sub-block, a portion of memory cells MC in the memory block BLKa may be simultaneously erased according to an erase request (e.g., an erase request from an external memory controller), and the other memory cells MC in the memory block BLKa may be erase-inhibited. A low voltage (e.g., a ground voltage or a low voltage of which the level is similar to that of the ground voltage) may be supplied to a word line connected to erased memory cells MC, and a word line connected to erase-inhibited memory cells MC may be floated.

In an exemplary embodiment of the inventive concept, the memory block BLKa may include a physical storage space which is distinguished by a block address. Each of the word lines WL1 to WL6 may correspond to a physical storage space which is distinguished by a row address. Each of the bit lines BL1 and BL2 may correspond to a physical storage space which is distinguished by a column address. Each of string selection lines SSL1a and SSL2a or SSL1b and SSL2b in different rows or each of the ground selection lines GSL1 and GSL2 in different rows may correspond to a physical storage space which is identified by a plane address.

The memory block BLKa shown in FIG. 2 is an example. However, the inventive concept may not be limited thereto. For example, the number of rows of cell strings may increase or decrease. As the number of rows of cell strings is changed, the number of string or ground selection lines and the number of cell strings connected to a bit line may also be changed.

The number of columns of cell strings may increase or decrease. If the number of columns of cell strings is changed, the number of bit lines connected to columns of cell strings and the number of cell strings connected to a string selection line may also be changed.

A height of the cell strings may increase or decrease. For example, the number of ground selection transistors, memory cells, or string selection transistors that are stacked in each cell string may increase or decrease.

In an exemplary embodiment of the inventive concept, memory cells MC in a physical page may correspond to at least three logical pages. For example, k bits (k being an integer of 2 or more) may be programmed in a memory cell MC. In memory cells MC of one physical page, k logical pages may be implemented with k bits programmed in each memory cell MC.

For example, a physical page may include a physical storage space which is distinguished by a block address, a row address, a column address, and a plane address. One physical page may include two or more logical pages. Each of the logical pages may include a logical storage space which is distinguished by an additional address (or an offset) for identifying logical pages as well as an address of a physical address.

In an exemplary embodiment of the inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" may mean that layers of each level of the array are directly deposited on the layers of each underlying level of the array.

In an exemplary embodiment of the inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference in their entireties, describe configurations of three-dimensional memory arrays, in which a three-dimensional memory array is configured in a plurality of levels, with word lines and/or bit lines shared between the levels: U.S. Pat. Nos. 7,679,133; 8,553,466; 8,654,587; 8,559,235; and U.S. Pat. Pub. No. 2011/0233648.

Figure 3:
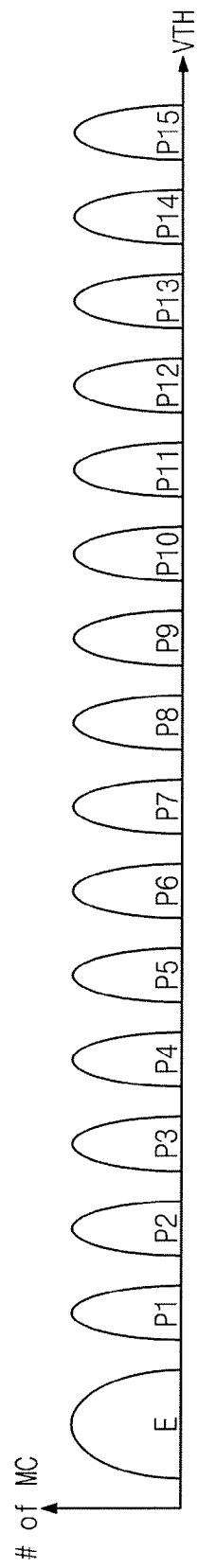
FIG. 3 illustrates states of memory cells at which data is written in accordance with an exemplary embodiment of the inventive concept.

FIG. 3 illustrates states of memory cells MC at which data is written in accordance with an exemplary embodiment of the inventive concept. In FIG. 3, the abscissa (e.g., x-axis) represents threshold voltages VTH of memory cells MC, and the ordinate (e.g., y-axis) represents the number of memory cells MC.

Referring to FIGS. 2 and 3, 4-bit data may be stored at each memory cell MC. The memory cells MC at which 4-bit data is stored may have an erase state E and first to fifteenth program states P1 to P15 based on a threshold voltage distribution range. Each of the memory cells MC may be programmed to have one of the erase state E and the first to fifteenth program states P1 to P15, based on 4-bit data to be stored therein.

The inventive concept may not be limited to writing 4-bit data to the memory cells MC. For example, n-bit data may be written to memory cells MC. In this case, the memory cells MC may be distributed to have one of $2^n$ states including an erase state.

FIG. 4 is a flow chart illustrating an operating method of the storage device 100 according to an exemplary embodiment of the inventive concept. In FIG. 4, there is illustrated a method in which the controller 120 writes write data groups to the nonvolatile memory device 110.

Referring to FIGS. 1, 2, and 4, in step S110, the controller 120 may collect write data groups corresponding to a plurality of physical pages. For example, the controller 120 may receive write data groups corresponding to a plurality of physical pages from the external host device and may collect the write data groups using the RAM 130.

In step S120, the controller 120 may simultaneously perform a common write operation with respect to the plurality of pages, based on the collected write data groups.

In step S130, the controller 120 may perform individual write operations with respect to the plurality of pages, based on the collected write data groups.

In other words, the controller 120 may write the collected write data groups to a plurality of physical pages by simultaneously performing a common write operation with respect to the plurality of pages and performing individual write operations with respect to the plurality of pages.

FIG. 5 is a flow chart illustrating a procedure for performing a common write operation, according to an exemplary embodiment of the inventive concept. Referring to FIGS. 1, 2, and 5, in step S210, the controller 120 may detect a common data group among a plurality of write data groups, using the state detector 128. For example, the size of the common data group may correspond to one page. The common data group may refer to a write data group of data, which corresponds to bit lines and has the lowest program state (e.g., a threshold distribution range), from among a plurality of write data groups.

In step S220, the controller 120 may perform a common write operation based on the detected common data group. For example, the controller 120 may transmit the detected common data group to the nonvolatile memory device 110. The controller 120 may control, through the write controller 129, the nonvolatile memory device 110 to simultaneously perform a common write operation with respect to a plurality of physical pages using the common data group.

Figure 6:
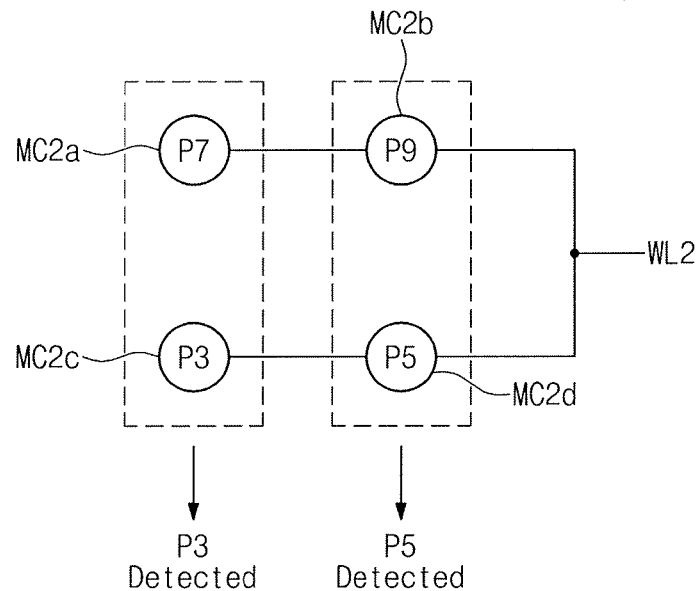
FIG. 6 illustrates detecting a common data group in accordance with an exemplary embodiment of the inventive concept.

FIG. 6 illustrates detecting a common data group in accordance with an exemplary embodiment of the inventive concept. Referring to FIGS. 2 and 6, an example in which a common data group is detected will be described with reference to memory cells MC2a to MC2d connected to a second word line WL2.

The memory cells MC2a and MC2b may be placed between one string selection line SSL2a or SSL2b and one ground selection line GSL2, may be connected in common to the word line WL2, and may correspond to a plurality of bit lines BL1 and BL2. In other words, the memory cells MC2a and MC2b may compose a page. The memory cells MC2c and MC2d may be placed between one string selection line SSL1a or SSL1b and one ground selection line GSL1, may be connected in common to the word line WL2, and may correspond to a plurality of bit lines BL1 and BL2. In other words, the memory cells MC2c and MC2d may compose a page.

In an exemplary embodiment of the inventive concept, a write data group to be written to the memory cells MC2a and MC2b may correspond to a seventh program state P7 and a ninth program state P9. A write data group to be written to the memory cells MC2c and MC2d may correspond to a third program state P3 and a fifth program state P5. If the memory cells MC2a to MC2d are selected for a common write operation, a common data group may be detected from write data groups to be written to the memory cells MC2a to MC2d.

The memory cells MC2a and MC2c may correspond to the bit line BL2. In a write data group to be written to the memory cells MC2a to MC2c, data which corresponds to the bit line BL2 and has the lowest program state (or the lowest threshold distribution range) may correspond to the third program state P3. Accordingly, the third program state P3 may be detected in connection with the bit line BL2.

The memory cells MC2b and MC2d may correspond to the bit line BL1. In a write data group to be written to the memory cells MC2b to MC2d, data which corresponds to the bit line BL1 and has the lowest program state (or the lowest threshold distribution range) may correspond to the fifth program state P5. Accordingly, the fifth program state P5 may be detected in connection with the bit line BL1.

In other words, the common data group may include the fifth program state P5 corresponding to the bit line BL1 and the third program state P3 corresponding to the bit line BL2.

Figure 7:
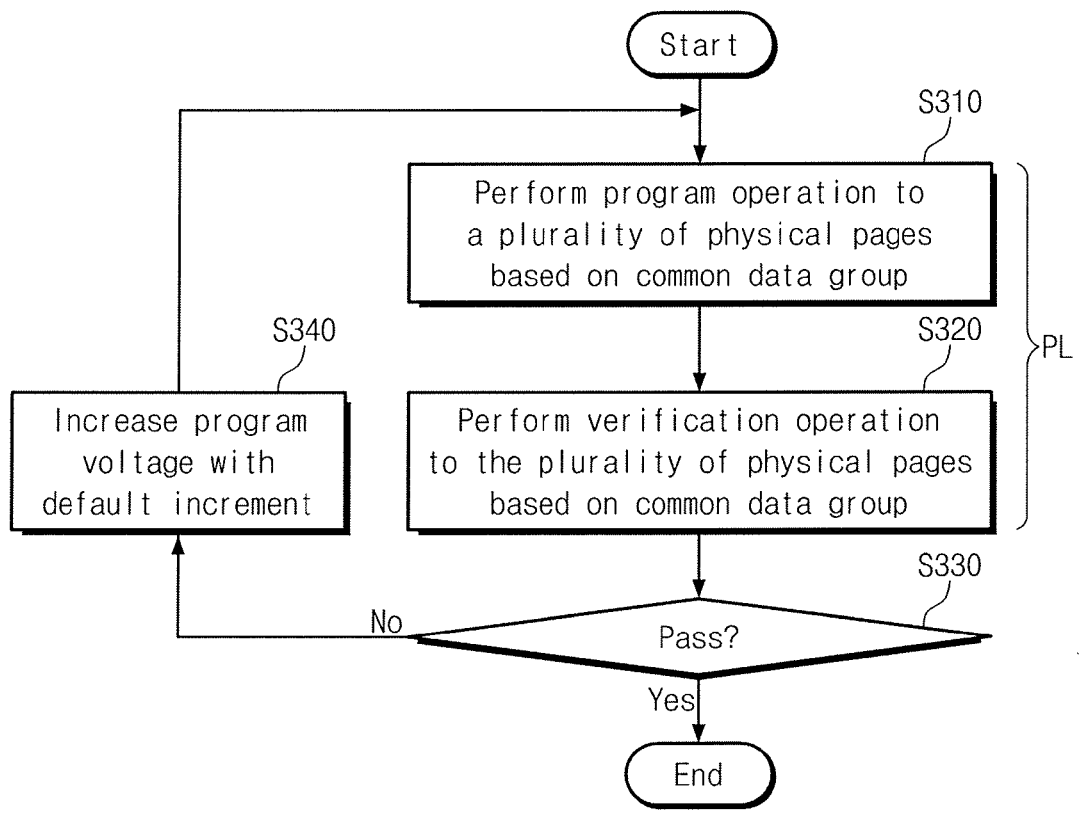
FIG. 7 is a flow chart illustrating performing a common write operation in accordance with an exemplary embodiment of the inventive concept.

FIG. 7 is a flow chart illustrating performing a common write operation in accordance with an exemplary embodiment of the inventive concept. Referring to FIGS. 1, 2, and 7, in step S310, the nonvolatile memory device 110 may perform a program operation with respect to a plurality of physical pages. For example, the nonvolatile memory device 110 may apply a program voltage to physical pages to be programmed, to a word line.

In step S320, the nonvolatile memory device 110 may perform a verification operation with respect to the plurality of physical pages. For example, the nonvolatile memory device 110 may apply a verification voltage to physical pages to be programmed, to a word line.

Steps S310 and S320 may compose a program loop PL. If the program loop PL is performed, threshold voltages of memory cells corresponding to a program target are to be increased. In other words, the program target may be memory cells whose threshold voltages are to be increased, from among the memory cells of the plurality of physical pages.

In step S330, the nonvolatile memory device 110 may determine whether or not the programming passed. For example, the nonvolatile memory device 110 may determine threshold voltages of memory cells to be programmed if they reach a target program state. If the threshold voltages of the memory cells reach the target program state, the program pass is determined, and the common write operation may be terminated. If the threshold voltages of the memory cells do not teach the target program state, the program fail occurs. In this case, in step S340, the nonvolatile memory device 110 may increase the program voltage by a default increment or by an increment gradually decreasing from the default increment as the program loop PL is performed and may again perform the program loop PL.

FIG. 8 illustrates performing a program operation and a verification operation of FIG. 7 in accordance with an exemplary embodiment of the inventive concept. In an exemplary embodiment of the inventive concept, as described with reference to FIG. 6, it may be assumed that a common write operation is performed with respect to physical pages connected to a second word line WL2.

Referring to FIGS. 1, 2, and 8, during a program operation, a program allowance voltage VALW and a program inhibition voltage VIHB may be applied to bit lines BL1 and BL2. Memory cells corresponding to a bit line to which the program allowance voltage VALW is applied may be programmed, in other words, an increase in threshold voltages thereof may be occur. The program allowance voltage VALW may be a ground voltage or a voltage of which the level is similar to that of the ground voltage. The program allowance voltage VALW may be applied to a bit line connected to memory cells, whose threshold voltages are to be increased, from among memory cells of physical pages selected for a common write operation, based on a common data group and a positive program pass.

Memory cells corresponding to a bit line to which the program inhibition voltage VIHB is applied may be program inhibited, in other words, an increase in threshold voltages thereof may be inhibited. The program inhibition voltage VIHB may be a power supply voltage or a voltage of which the level is similar to that of the power supply voltage. The program inhibition voltage VIHB may be applied to a bit line connected to memory cells, whose threshold voltages are to be inhibited from increasing, from among memory cells of physical pages selected for a common write operation, based on a common data group and a negative program pass or a program fail.

Turn-on voltages VON may be applied to string selection lines SSL1a, SSL1b, SSL2a, and SSL2b corresponding to physical pages selected for a common write operation. The turn-on voltages VON may be voltages for turning on the string selection transistors SSTa and SSTb. Each of the turn-on voltages VON may be the power supply voltage or a voltage of which the level is similar to the power supply voltage. The turn-on voltages VON may be the same as each other or different from each other.

Pass voltages VPASS may be applied to word lines WL1 and WL3 to WL6 which are not connected to physical pages selected for a common write operation. The pass voltages VPASS may be voltages for turning on memory cells MC1 and MC3 to MC6 regardless of whether the memory cells MC1 and MC3 to MC6 are programmed. Each of the pass voltages VPASS may be a high voltage. The pass voltages VPASS may be voltages which are the same as each other or different from each other.

A program voltage VPGM may be applied to a word line WL2 connected to physical pages selected for a common write operation. The program voltage VPGM may be higher than the pass voltages VPASS.

Turn-off voltages VOFF may be applied to ground selection lines GSL1 and GSL2. The turn-off voltages VOFF may be voltages for turning off the ground selection transistors GST. Each of the turn-off voltages VOFF may be the ground voltage or a voltage of which the level is similar to that of the ground voltage. The turn-off voltages VOFF may be voltages which are the same as each other or different from each other.

During a verification operation, precharge voltages VPRE may be applied to bit lines BL1 and BL2. Each of the precharge voltages VPRE may be the power supply voltage or a voltage of which the level is similar to the power supply voltage. The precharge voltages VPRE may be voltages which are the same as each other or different from each other.

The turn-on voltages VON may be applied to string selection lines SSL1a, SSL1b, SSL2a, and SSL2b corresponding to physical pages selected for a common write operation.

Read pass voltages VREAD may be applied to word lines WL1 and WL3 to WL6 which are not connected to physical pages selected for a common write operation. The read pass voltages VREAD may be voltages for turning on memory cells MC1 and MC3 to MC6 regardless of whether the memory cells MC1 and MC3 to MC6 are programmed. Each of the read pass voltages VREAD may be a high voltage. The read pass voltages VREAD may be the same as each other or different from each other.

Verification voltages VFY may be applied to the word line WL2 connected to physical pages selected for a common write operation. The turn-on voltages VON may be applied to ground selection lines GSL1 and GSL2.

For example, different verification voltages VFY may be sequentially applied to the word line WL2 based on data of a common data group corresponding to each bit line. For example, data of the common data group corresponding to the bit line BL1 may correspond to the fifth program state P5, and data of the common data group corresponding to the bit line BL2 may correspond to the third program state P3. Accordingly, a verification voltage of the third program state P3 and a verification voltage of the fifth program state P5 may be sequentially applied to the word line WL2.

Whether threshold voltages of the memory cells MC2a and MC2c are greater than a verification voltage may be determined when a verification voltage of the third program state P3 corresponding to the bit line BL2 is applied. The program fail may be determined, for example, when a threshold voltage of at least one (or memory cells corresponding to at least a predetermined threshold voltage) of the memory cells MC2a and MC2c is lower than a verification voltage.

Whether threshold voltages of the memory cells MC2b and MC2d are greater than a verification voltage may be determined when a verification voltage of the fifth program state P5 corresponding to the bit line BL1 is applied. The program fail may be determined, for example, when a threshold voltage of at least one (or memory cells corresponding to at least a predetermined threshold voltage) of the memory cells MC2b and MC2d is lower than a verification voltage.

FIG. 9 illustrates performing a program operation and a verification operation of FIG. 7 in accordance with an exemplary embodiment of the inventive concept. Compared with the example of FIG. 8, a verification operation of FIG. 9 may be divided into a first verification operation and a second verification operation. For example, the verification operation may be performed with respect to each of a plurality of physical pages for a common write operation. For example, the verification operation may be sequentially performed with respect to a physical page (or physical pages), corresponding to a verification operation, from among physical pages corresponding to a common write operation.

Voltage conditions of a program operation described with reference to FIG. 9 may be the same as those described with reference to FIG. 8, and thus, a detailed description thereof is omitted.

During the first verification operation, a physical page, corresponding to first string selection lines SSL1a and SSL1b, from among physical pages selected for a common write operation may be selected for a verification operation. During the first verification operation, turn-on voltages VON may be applied to the first string selection lines SSL1a and SSL1b, and turn-off voltages VOFF may be applied to second string selection lines SSL2a and SSL2b.

A verification voltage of the third program state P3 and a verification voltage of the fifth program state P5 may be sequentially applied to the word line WL2. Whether a threshold voltage of the memory cell MC2c is greater than a verification voltage may be determined when a verification voltage of the third program state P3 is applied. Whether a threshold voltage of the memory cell MC2d is greater than a verification voltage may be determined when a verification voltage of the fifth program state P5 is applied. The remainder of the first verification operation is similar to the verification operation of FIG. 8.

During the second verification operation, a physical page, corresponding to second string selection lines SSL2a and SSL2b, from among physical pages selected for a common write operation may be selected for a verification operation. During the second verification operation, the turn-on voltages VON may be applied to the second string selection lines SSL2a and SSL2b, and the turn-off voltages VOFF may be applied to first string selection lines SSL1a and SSL1b.

A verification voltage of the third program state P3 and a verification voltage of the fifth program state P5 may be sequentially applied to the word line WL2. Whether a threshold voltage of the memory cell MC2a is greater than a verification voltage may be determined when a verification voltage of the third program state P3 is applied. Whether a threshold voltage of the memory cell MC2b is greater than a verification voltage may be determined when a verification voltage of the fifth program state P5 is applied. The remainder of the second verification operation is similar to the verification operation of FIG. 8.

In FIG. 9, a criterion of the program fail or the program pass may be variously set. For example, in a program loop PL, verification operations may be performed based on data (e.g., target data) of a common data group corresponding to one bit line. If at least one memory cell is determined during the verification operations as being programmed with the target data, program pass may be determined. For example, if k (k is a positive integer less than the number of memory cells of a physical page) memory cells are determined during the verification operations as being programmed with the target data, program pass may be determined.

Figure 10:
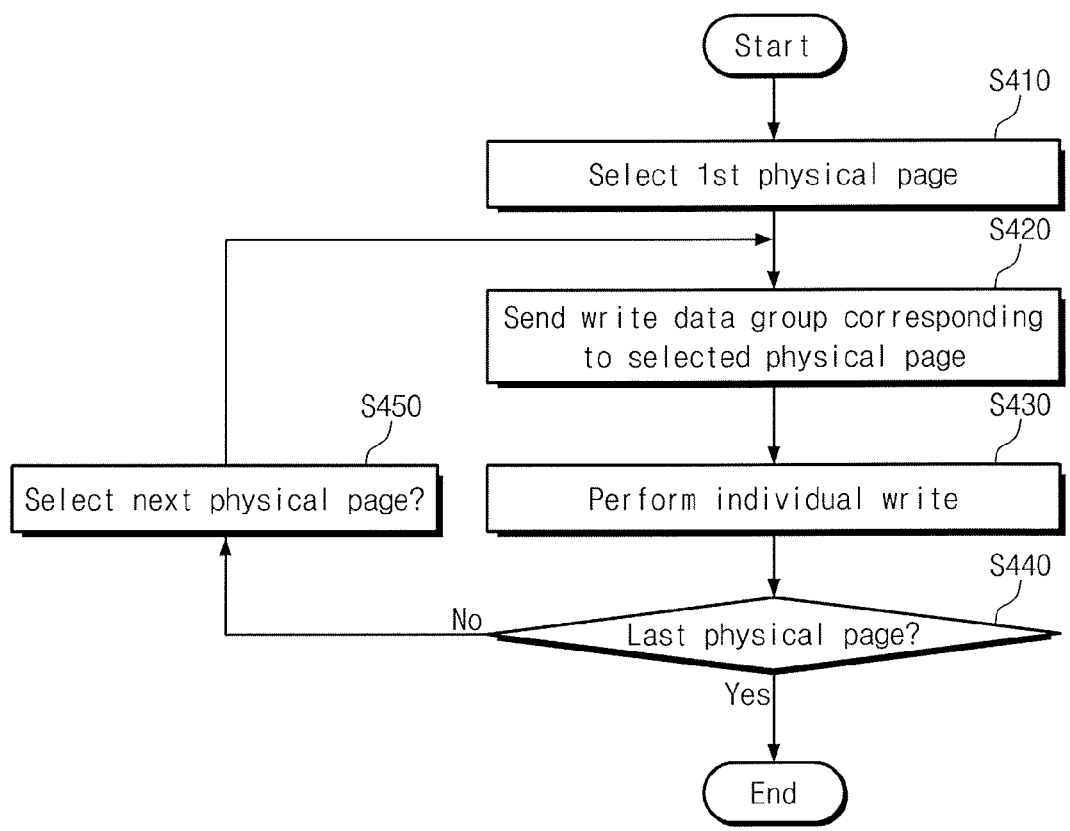
FIG. 10 is a flow chart illustrating performing individual write operations in accordance with an exemplary embodiment of the inventive concept.

After a common write operation is performed, individual write operations may be performed. FIG. 10 is a flow chart illustrating performing individual write operations in accordance with an exemplary embodiment of the inventive concept. Referring to FIGS. 1, 2, and 10, in step S410, the controller 120 may select a first physical page among physical pages selected for a common write operation. For example, the controller 120 may transmit an address corresponding to a selected physical page to the nonvolatile memory device 110.

In step S420, the controller 120 may transmit a write data group corresponding to the selected physical page to the nonvolatile memory device 110. For example, the controller 120 may transmit a write data group to be written to the selected physical page to the nonvolatile memory device 110.

In step S430, the controller 120 may control the nonvolatile memory device 110 such that the transmitted write data group is written to the selected physical page.

If the selected physical page is not a last physical page as determined in step S440, in step S450, a next physical page may be selected. Afterwards, in steps S420 and S430, an individual write operation may be performed with respect to the next physical page. If, however, the selected physical page is a last physical page, the process may end.

Figure 11:
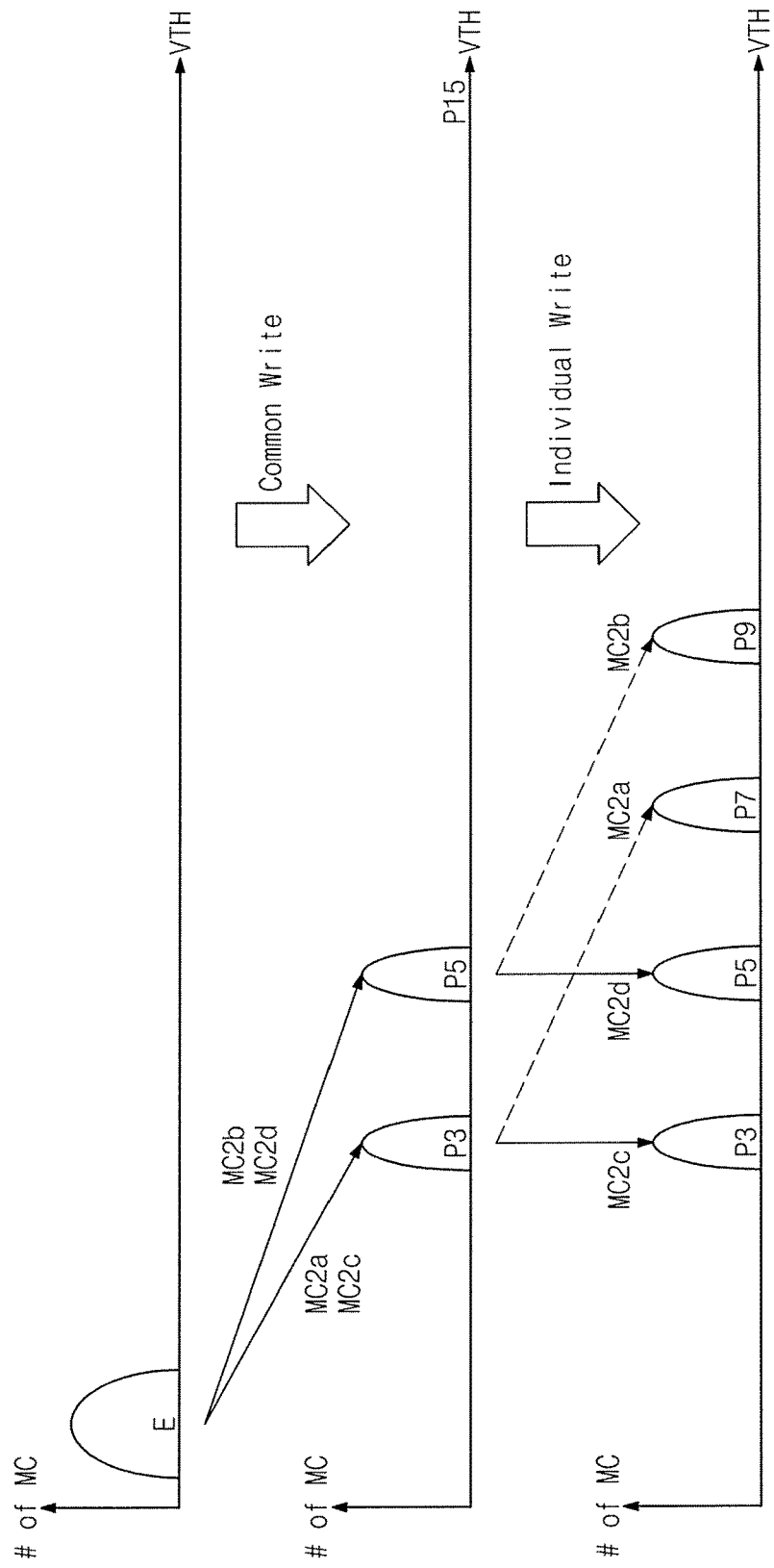
FIG. 11 illustrates a change of threshold voltages of memory cells by a common write operation and individual write operations in accordance with an exemplary embodiment of the inventive concept.

FIG. 11 illustrates a change of threshold voltages of memory cells MC2a to MC2d by a common write operation and individual write operations in accordance with an exemplary embodiment of the inventive concept. In FIG. 11, the abscissa (e.g., x-axis) represents threshold voltages of memory cells MC, and the ordinate (e.g., y-axis) represents the number of memory cells MC.

Referring to FIGS. 1, 2, 6, and 11, before data groups are written, memory cells MC2a to MC2d may have an erase state E.

If a common write operation is performed using a common data group, the memory cells MC2a and MC2c may be programmed to the third program state P3, and the memory cells MC2b and MC2d may be programmed to the fifth program state P5.

After the common write operation is performed, individual write operations may be performed using write data groups. If an individual write operation is performed with respect to the memory cells MC2c and MC2d, the memory cell MC2c may be finely programmed to the third program state P3 or may maintain the third program state P3, and the memory cell MC2d may be finely programmed to the fifth program state P5 or may maintain the fifth program state P5.

If an individual write operation is performed with respect to the memory cells MC2a and MC2b, the memory cell MC2a may be programmed to the seventh program state P7 from the third program state P3, and the memory cell MC2b may be programmed to the ninth program state P9 from the fifth program state P5.

If the common write operation and the individual write operations are performed, the number of times that a program voltage is applied when programming physical pages may be reduced. In this case, the stress to memory cells may be reduced. This way, the nonvolatile memory device 110 and the storage device 100 have increased reliability.

Figure 12:
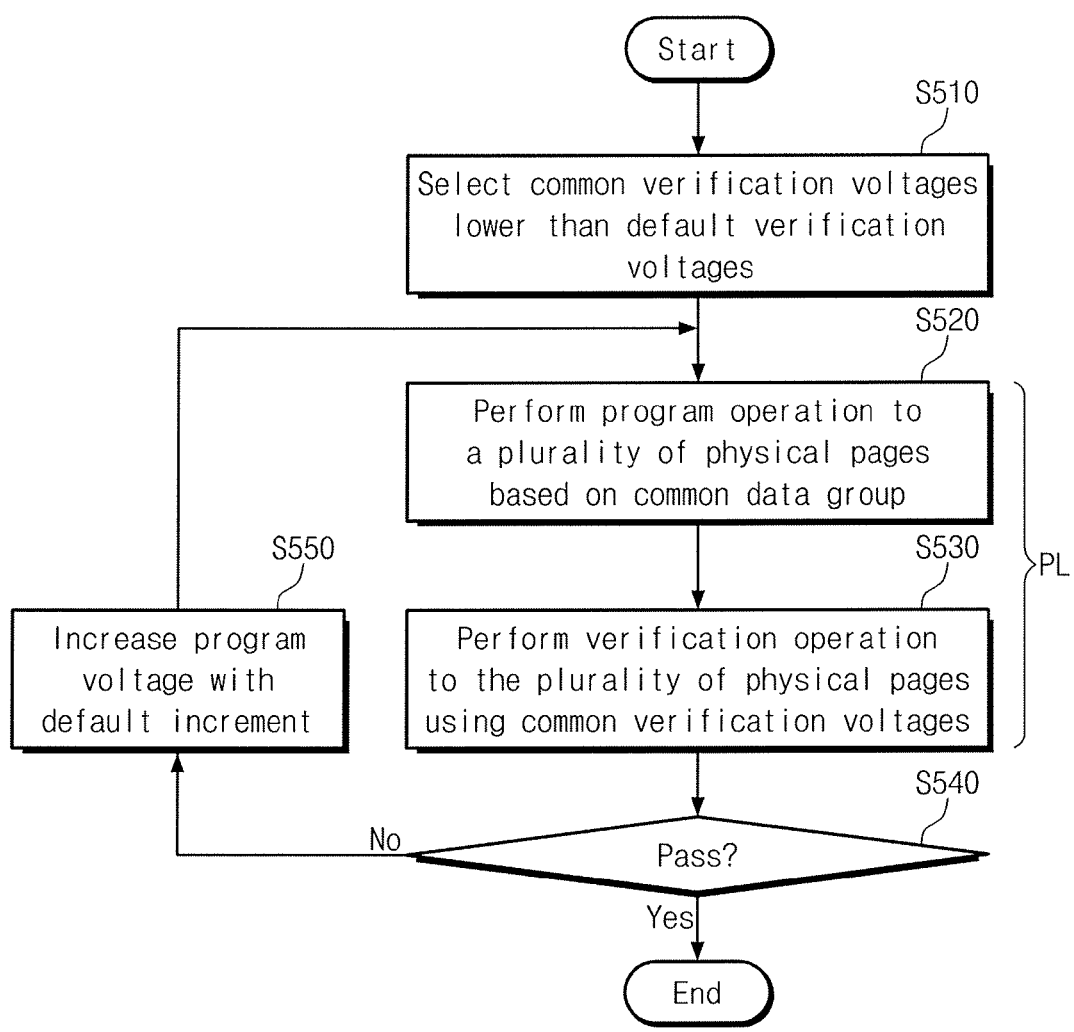
FIG. 12 is a flow chart illustrating an application of an operating method of FIG. 7 in accordance with an exemplary embodiment of the inventive concept.

FIG. 12 is a flow chart illustrating an application of an operating method of FIG. 7 in accordance with an exemplary embodiment of the inventive concept. Referring to FIGS. 1, 2, and 12, in step S510, the controller 120 may select a common verification voltage lower than a default verification voltage of each program state of a common data group. The controller 120 may transmit information about common verification voltages to the nonvolatile memory device 110. For example, default verification voltages may be verification voltages used in the individual write operations or when the common write operation is inactivated. For example, the default verification voltages may verification voltages used when an individual write operation is performed with respect to each memory cell connected to each bit line. The common verification voltages may verification voltages used when a common write operation is performed with respect to two or more memory cells connected to each bit line.

In step S520, the controller 120 may control the nonvolatile memory device 110 to perform a program operation with respect to a plurality of physical pages based on a common data group. In step S530, the controller 120 may control the nonvolatile memory device 110 to perform a verification operation using the common verification voltages. Steps S520 and S530 may compose a program loop PL.

Afterwards, program fail or program pass may be determined in step S540. If program fail occurs, in step S550, the program voltage may increase by a default increment or by an increment gradually decreasing from the default increment as the program loop PL is performed. Afterwards, a program loop PL, in other words, steps S520 and S530 may be again performed. If program pass occurs, the process may end.

As described with reference to FIG. 12, the common write operation may be performed using common verification voltages lower than the default verification voltages. Accordingly, memory cells may be prevented from being over-programmed due to the common write operation.

Figure 13:
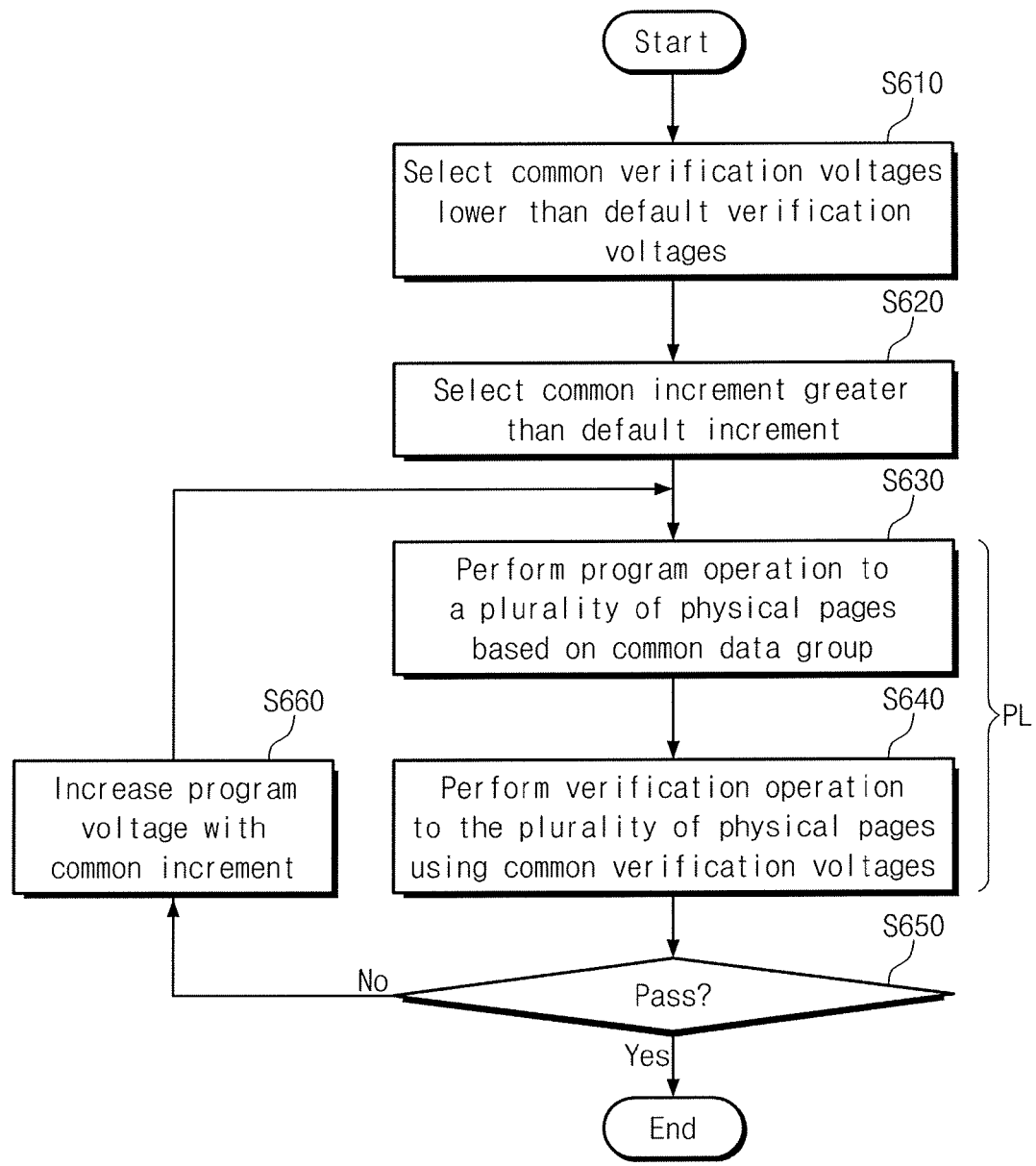
FIG. 13 is a flow chart illustrating an application of an operating method of FIG. 12 in accordance with an exemplary embodiment of the inventive concept.

FIG. 13 is a flow chart illustrating an application of an operating method of FIG. 12 in accordance with an exemplary embodiment of the inventive concept. Referring to FIGS. 1, 2, and 13, in step S610, the controller 120 may select a common verification voltage lower than a default verification voltage of each program state of a common data group. The controller 120 may transmit information about the common verification voltages to the nonvolatile memory device 110.

In step S620, the controller 120 may select a common increment greater than a default increment. The controller 120 may transmit information about the common increment to the nonvolatile memory device 110. For example, the default increment may be an increment used in the individual write operations or when the common write operation is inactivated.

In step S630, the controller 120 may control the nonvolatile memory device 110 to perform a program operation with respect to a plurality of physical pages based on a common data group. In step S640, the controller 120 may control the nonvolatile memory device 110 to perform a verification operation using the common verification voltages. Steps S630 and S640 may compose a program loop PL.

Afterwards, program fail or program pass may be determined in step S650. If the program fail occurs, in step S660, the program voltage may increase by the common increment. Afterwards, a program loop PL, in other words, steps S630 and S640 may be again performed. If program pass occurs, the process may end.

As described with reference to FIG. 13, a program operation of the common write operation may be performed while increasing the program voltage by the common increment greater than the default increment. Accordingly, the common write operation may be performed faster than the individual write operation.

Figure 14:
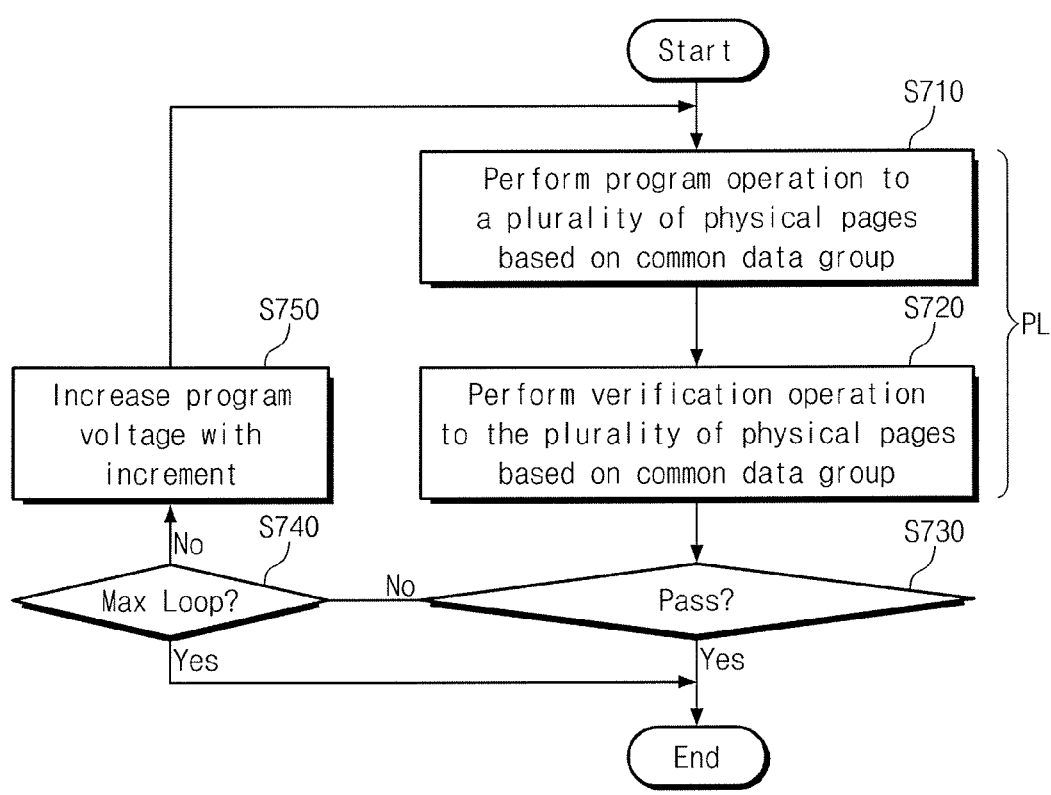
FIG. 14 is a flow chart illustrating an application of an operating method of FIG. 7 in accordance with an exemplary embodiment of the inventive concept.

FIG. 14 is a flow chart illustrating still an application of an operating method of FIG. 7 in accordance with an exemplary embodiment of the inventive concept. Referring to FIGS. 1, 2, and 14, in step S710, the controller 120 may control the nonvolatile memory device 110 to perform a program operation with respect to a plurality of physical pages based on a common data group. In step S720, the controller 120 may control the nonvolatile memory device 110 to perform a verification operation based on the common data group. Steps S710 and S740 may compose a program loop PL.

Afterwards, program fail or program pass may be determined in step S730. If the program fail occurs, in step S740, whether a current program loop is a maximum program loop may be determined. For example, whether the program loop PL is performed as many times as a predetermined threshold value may be determined. If the program loop PL is performed as many times as a predetermined threshold value, the common write operation may be terminated. If the program loop PL is not performed as many times as a predetermined threshold value, in step S750, the program voltage may increase by a default increment or by an increment gradually decreasing from the default increment as the program loop PL is performed. Afterwards, a program loop PL, in other words, steps S710 and S720 may be again performed. If program pass occurs, the process may end.

As described with reference to FIG. 14, even though no program pass occurs during the common write operation, the common write operation may be terminated if the program loop PL is performed by a predetermined threshold value. Afterwards, individual write operations may be performed.

In an exemplary embodiment of the inventive concept, two or more of examples described with reference to FIGS. 7, 12, 13, and 14 may be combined.

Figure 15:
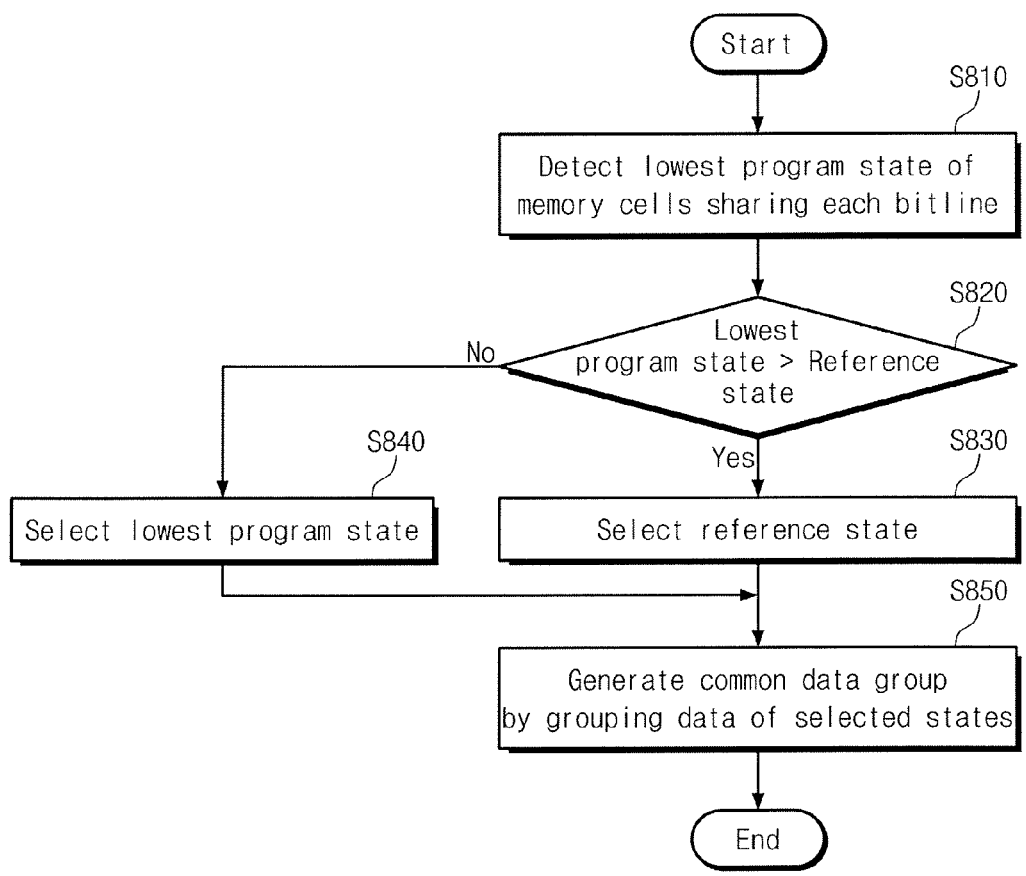
FIG. 15 is a flow chart illustrating generating a common data group in accordance with an exemplary embodiment of the inventive concept.

FIG. 15 is a flow chart illustrating generating a common data group in accordance with an exemplary embodiment of the inventive concept. Referring to FIGS. 1, 2, and 15, in step S810, the controller 120 may detect the lowest program state of memory cells, sharing each bit line, from among memory cells in physical pages selected for a common write operation.

In step S820, whether the lowest program state is higher than a reference state may be determined. If the lowest program state is higher than the reference state, in step S830, the reference state may be selected. If the lowest program state is not higher than the reference state, in step S840, the lowest program state may be selected. Afterwards, in step S850, a common data group may be generated by grouping selected states.

In other words, an upper limit of a program state at which memory cells are able to be written during a common write operation may be set to the reference state. Programming to a program state higher than the reference state may be inhibited during the common write operation.

Figure 16:
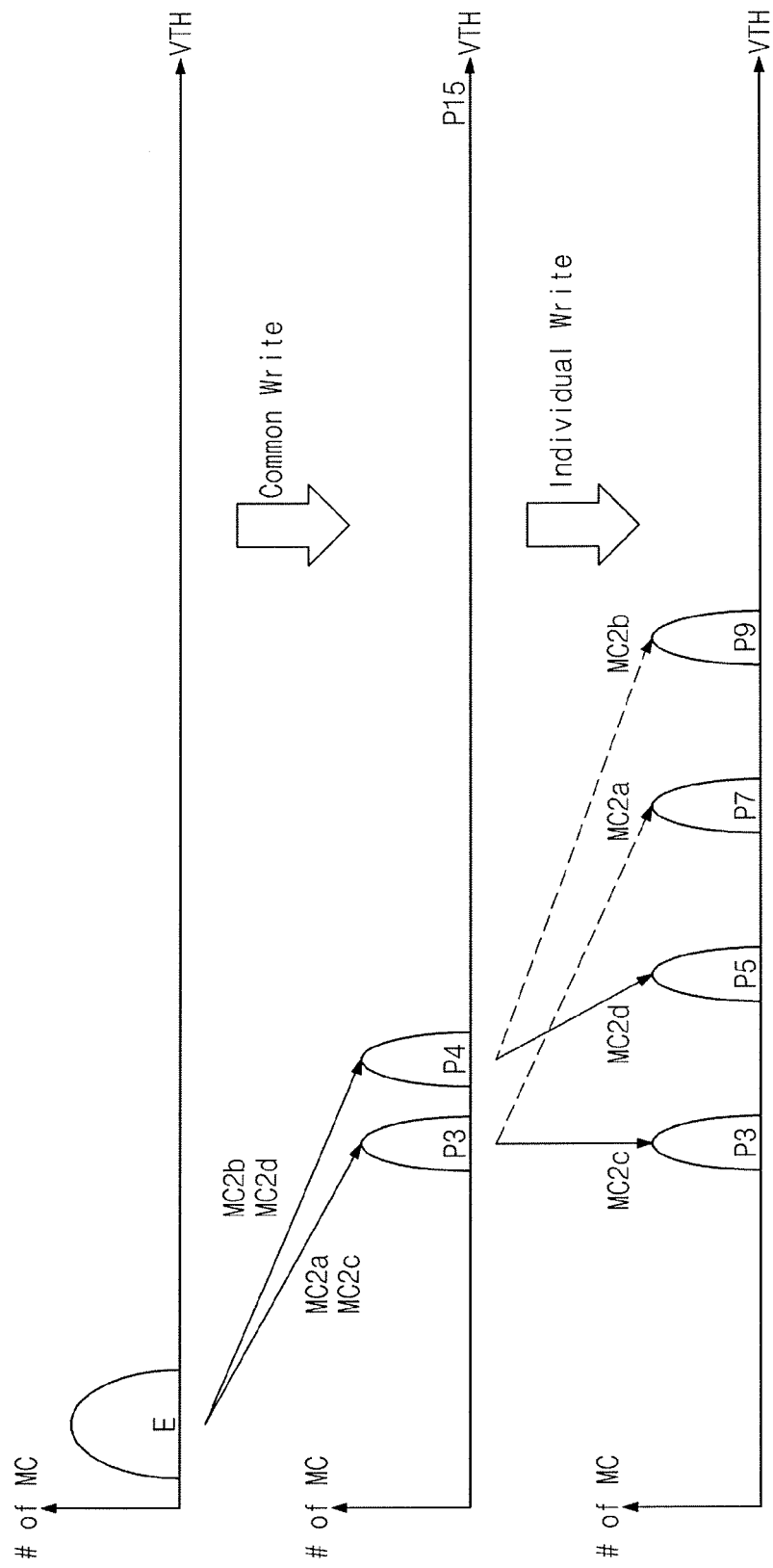
FIG. 16 illustrates performing a common write operation and individual write operations when an application of FIG. 15 is used in accordance with an exemplary embodiment of the inventive concept.

FIG. 16 illustrates performing a common write operation and individual write operations when an application of FIG. 15 is used in accordance with an exemplary embodiment of the inventive concept. In FIG. 16, the abscissa (e.g., x-axis) represents threshold voltages of memory cells MC, and the ordinate (e.g., y-axis) represents the number of memory cells MC.

Referring to FIGS. 1, 6, 15, and 16, before a common write operation is performed, memory cells MC2a to MC2d may have an erase state E. The third program state P3 and the fifth program state P5 may be detected as the lowest program state, corresponding to each bit line, from write data groups of the memory cells MC2a to MC2d.

In an exemplary embodiment of the inventive concept, the fourth program state P4 may be set to the reference state. In this case, there may be selected the fourth program state P4 instead of the fifth program state P5. In other words, the common data group may include data of the third program state P3 and data of the fourth program state P4.

If a common write operation is performed, the memory cells MC2a and MC2c may be programmed to the third program state P3, and the memory cells MC2b and MC2d may be programmed to the fourth program state P4.

If an individual write operation is performed, the memory cell MC2c may be finely programmed to the third program state P3 or may maintain the third program state P3. The memory cell MC2d may be programmed to the fifth program state P5 from the fourth program state P4. The memory cell MC2a may be programmed to the seventh program state P7 from the third program state P3. The memory cell MC2b may be programmed to the ninth program state P9 from the fourth program state P4.

As described above, the storage device according to an exemplary embodiment of the inventive concept may write data to a plurality of physical pages through a common write operation and individual write operations. Accordingly, the reliability of the storage device 100 may be increased.

Returning to FIG. 1, the nonvolatile memory device 110 may perform read, write and erase operations under control of the controller 120. The nonvolatile memory device 110 may receive a command and an address from the controller 120 through an input/output channel. The nonvolatile memory device 110 may exchange data with the controller 120 through the input/output channel.

The nonvolatile memory device 110 may exchange a control signal with the controller 120 through a control channel. For example, the nonvolatile memory device 110 may receive, from the controller 120, at least one of a chip enable signal /CE for selecting at least one of a plurality of nonvolatile memory chips in the nonvolatile memory device 110, a command latch enable signal CLE indicating that a signal received from the controller 120 through the input/output channel is a command, an address latch enable signal ALE indicating that a signal received from the controller 120 through the input/output channel is an address, a read enable signal /RE generated by the controller 120 at a read operation, and a write enable signal /WE activated by the controller 120 when the command or the address is transmitted. The read enable signal /RE may be periodically toggled and used to tune timing. The nonvolatile memory device 110 may further receive, from the controller 120, a write protection signal /WP activated by the controller 120 to prevent unintended writing or erasing when a power changes, and a data strobe signal DQS used to adjust input synchronization of data transmitted through the input/output channel and generated by the controller 120 at a write operation so as to be periodically toggled. For example, the nonvolatile memory device 110 may output, to the controller 120, at least one of a ready/busy signal R/nB indicating whether the nonvolatile memory device 110 is performing a program, erase or read operation and a data strobe signal DQS used to adjust output synchronization of data generated in response to the read enable signal /RE by the nonvolatile memory device 110 so as to be periodically toggled.

The nonvolatile memory device 110 may include a flash memory. However, the inventive concept may not be limited thereto. For example, the nonvolatile memory device 110 may incorporate at least one of nonvolatile memory devices, such as a random access memory (RAM), a phase-change RAM (PRAM), a magnetic RAM (MRAM), a resistive RAM (RRAM), and a ferroelectric RAM (FeRAM).

The controller 120 may be configured to access the nonvolatile memory device 110. For example, the controller 120 may control the nonvolatile memory device 110 through an input/output channel and a control channel to perform a write, read or erase operation.

The controller 120 may control the nonvolatile memory device 110 in response to control of an external host device. For example, the controller 120 may communicate with the external host device based on a format different from a format used for communications with the nonvolatile memory device 110. A unit of data which the controller 120 conveys to the nonvolatile memory device 110 may be different from a unit of data which the controller 120 conveys to the external host device.

The controller 120 may use the RAM 130 as a working memory, a buffer memory, or a cache memory. The controller 120 may store data or codes, used to manage the nonvolatile memory device 110, in the RAM 130. For example, the controller 120 may read data or codes, used to manage the nonvolatile memory device 110, from the nonvolatile memory device 110 and may load the read data or codes on the RAM 130 for driving.

The RAM 130 may include at least one of a variety of random access memories, such as, but not limited to, a static RAM (SRAM), a dynamic RAM (DRAM), a synchronous DRAM (SDRAM), a PRAM, a MRAM, a RRAM, and a FRAM.

The nonvolatile memory device 110 may include a plurality of nonvolatile memory chips. In an exemplary embodiment of the inventive concept, the controller 120 and the nonvolatile memory chips may be interconnected based on a channel and a way. One channel may include one data channel and one control channel. One data channel may include eight data lines. One control channel may include control lines for transferring the chip enable signal /CE, the command latch enable signal CLE, the address latch enable signal ALE, the read enable signal /RE, the write enable signal /WE, the write protect signal /WP, and the ready/busy signal R/nB.

Nonvolatile memory chips connected to one channel may constitute a way. When connected to one channel, n nonvolatile memory chips may compose an n-way. Nonvolatile memory chips belonging to one way may share data lines and the control lines for transferring the command latch enable signal CLE, the address latch enable signal ALE, the read enable signal /RE, the write enable signal /WE, and the write protect signal /WP. Each of nonvolatile memory chips belonging to one way may communicate with the controller 120 through dedicated control lines for the chip enable signal /CE and the ready/busy signal R/nB.

The controller 120 may alternately access n-way nonvolatile memory chips connected to one channel. The controller 120 may independently access nonvolatile memory chips connected with different channels. The controller 120 may alternately or simultaneously access nonvolatile memory chips connected with different channels.

In an exemplary embodiment of the inventive concept, nonvolatile memory chips may be connected with the controller 120 in the form of a wide input/output (IO). For example, nonvolatile memory chips connected to different channels may share a control line for a chip enable signal /CE. Nonvolatile memory chips which share the control line for the chip enable signal /CE may be accessed at the same time. Data lines of different channels may be used at the same time, and thus, a wide input/output bandwidth may be achieved.

The storage device 100 may include a solid state drive (SSD) or a hard disk drive (HDD). The storage device 100 may include memory cards, such as a PC card (e.g., a personal computer memory card international association (PCMCIA) card), a compact flash (CF) card, a smart media card (SM, SMC), a memory stick, a multimedia card (MMC, reduced size (RS)-MMC, MMCmicro), a secure digital card (SD, miniSD, microSD, secure digital high capacity (SDHC)), a universal serial bus (USB) memory card, and a universal flash storage (UFS). The storage device 100 may include embedded memories, such as an embedded Multi-Media card (eMMC), a UFS, and a Perfect Page NAND (PPN).

In FIG. 1, an exemplary embodiment of the inventive concept shows the RAM 130 outside the controller 120. However, the inventive concept may not be limited thereto. For example, the storage device 100 may not include the RAM 130 which is disposed outside the controller 120. The controller 120 may use an internal RAM (refer to FIG. 21) as a buffer memory, a working memory, or a cache memory.

Figure 17:
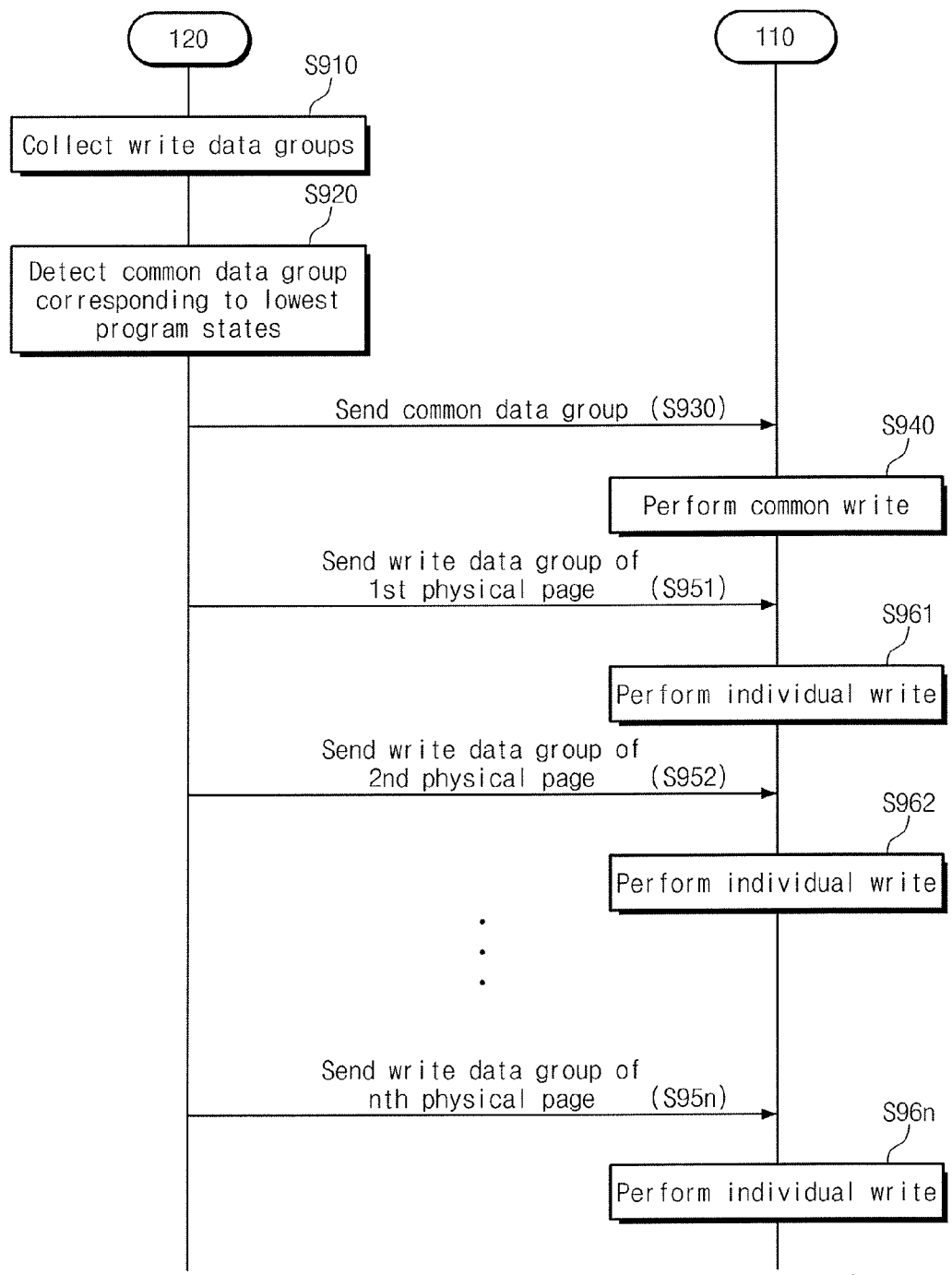
FIG. 17 illustrates communication between a nonvolatile memory device and a controller when a common write operation and individual write operations are performed in accordance with an exemplary embodiment of the inventive concept.

FIG. 17 illustrates communication between a nonvolatile memory device 110 and a controller 120 when a common write operation and individual write operations are performed in accordance with an exemplary embodiment of the inventive concept. Referring to FIGS. 1 and 17, in step S910, the controller 120 may collect a write data group received from the external host device.

In step S920, the controller 120 may detect a common data group corresponding to the lowest program states. In step S930, the controller 120 may transmit a common data group to the nonvolatile memory device 110. In step S940, the nonvolatile memory device 110 may perform a common write operation using the common data groups.

In step S951, the controller 120 may transmit a write data group corresponding to a first physical page to the nonvolatile memory device 110. In step S961, the nonvolatile memory device 110 may perform an individual write operation with respect to the first physical page using the received write data group.

In step S952, the controller 120 may transmit a write data group corresponding to a second physical page to the nonvolatile memory device 110. In step S962, the nonvolatile memory device 110 may perform an individual write operation with respect to the second physical page using the received write data group.

In step S95n, the controller 120 may transmit a write data group corresponding to an n-th physical page to the nonvolatile memory device 110. In step S96n, the nonvolatile memory device 110 may perform an n-th individual write operation with respect to the n-th physical page using the received write data group.

Figure 18:
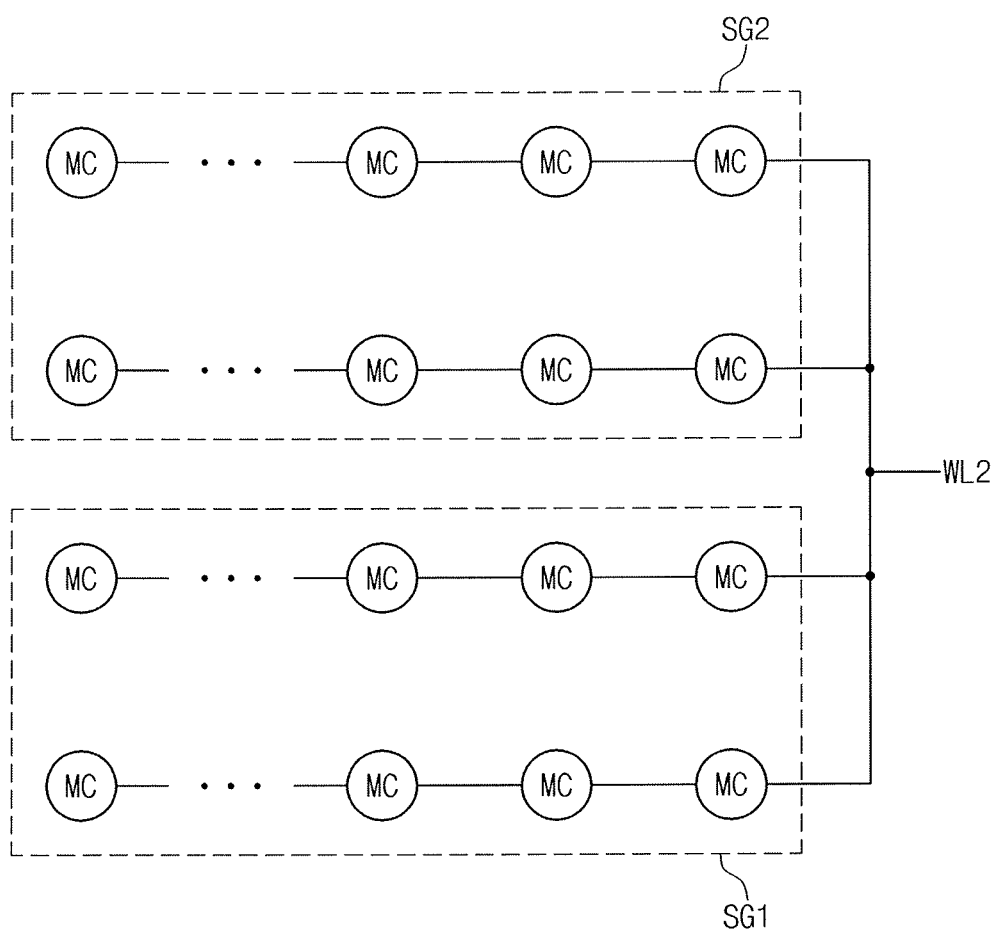
FIG. 18 illustrates an application of FIG. 6 in accordance with an exemplary embodiment of the inventive concept.

FIG. 18 illustrates an application of FIG. 6 in accordance with an exemplary embodiment of the inventive concept. Referring to FIGS. 1, 2, and 18, four planes may be disposed on one memory block. The four planes of the memory block may be divided into selection groups SG1 and SG2. In pages connected to one word line WL, a common write operation may be performed for a selection group. For example, individual write operations may be performed after a common write operation is performed with respect to pages, including memory cells belonging to the first selection group SG1, from among pages of memory cells connected to the word line WL2. Furthermore, individual write operations may be performed after a common write operation is performed with respect to pages, including memory cells belonging to the second selection group SG2, from among the pages of the memory cells connected to the word line WL2.

In other words, the common write operation may be performed, for a selection group, with respect to pages disposed in parallel on a substrate.

Figure 19:
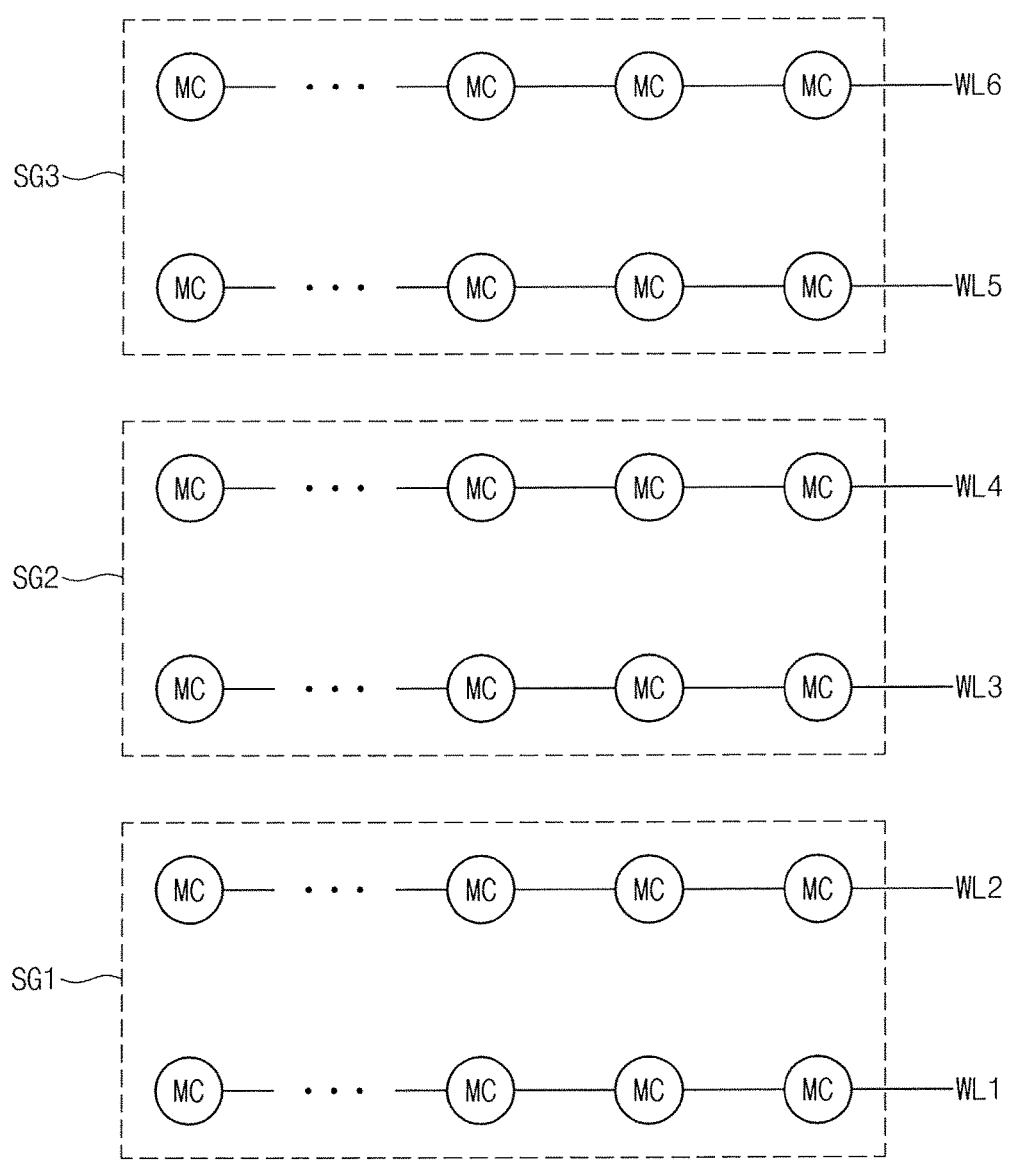
FIG. 19 illustrates an application of FIG. 6 in accordance with an exemplary embodiment of the inventive concept.

FIG. 19 illustrates an application of FIG. 6 in accordance with an exemplary embodiment of the inventive concept. Referring to FIGS. 1, 2, and 19, selection groups SG1 to SG3 may be arranged along a direction perpendicular to a substrate. Pages, including memory cells connected to first and second word lines WL1 and WL2, from among pages of memory cells disposed between a string selection line and a ground selection line may constitute the first selection group SG1. Pages connected to third and fourth word lines WL3 and WL4 may constitute the second selection group SG2. Pages connected to fifth and sixth word lines WL5 and WL6 may constitute the third selection group SG3.

In other words, the common write operation may be performed, for a selection group, with respect to pages disposed along a direction perpendicular to a substrate.

In an exemplary embodiment of the inventive concept, an example of FIG. 18 and an example of FIG. 19 may be able to be combined. In other words, the common write operation may be performed, for a selection group, with respect to pages disposed in a direction parallel with and perpendicular to an upper surface of the substrate. For example, each selection group may be in the form of a square pillar including pages arranged in a row direction, a column direction, and a height direction.

Exemplary embodiments of the inventive concept described as a common write operation and individual write operations performed with respect to a plurality of physical pages of a nonvolatile memory device having a three-dimensional structure. However, the inventive concept may not be limited thereto. For example, the inventive concept may be applied to a nonvolatile memory device having a planar structure. For example, the nonvolatile memory device having the planar structure may have the same structure as illustrated in FIG. 19. In other words, the selection groups SG1 to SG3 may be set in the nonvolatile memory device having the planar structure, based on an example described with reference to FIG. 19. The common write operation and the individual write operations may be performed on nonvolatile memory device having the planar structure, based on the selection groups SG1 to SG3.

Figure 20:
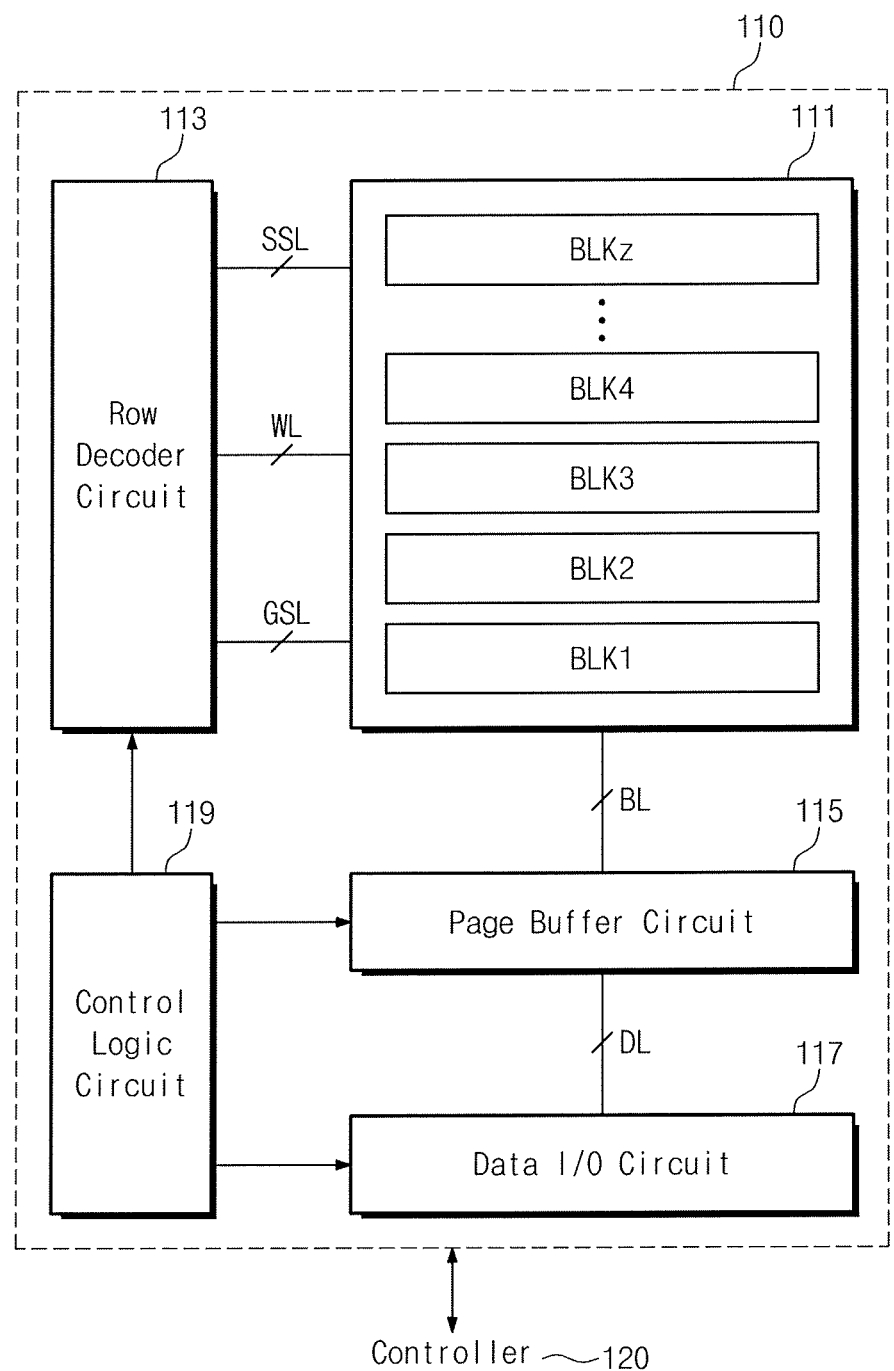
FIG. 20 is a block diagram illustrating a nonvolatile memory device according to an exemplary embodiment of the inventive concept.

FIG. 20 is a block diagram illustrating a nonvolatile memory 110 according to an exemplary embodiment of the inventive concept. Referring to FIGS. 1 and 20, the nonvolatile memory device 110 may include a memory cell array 111, a row decoder circuit 113, a page buffer circuit 115, a data input/output circuit 117, and a control logic circuit 119.

The memory cell array 111 may include a plurality of memory blocks BLK1 to BLKz. Each memory block may include a plurality of memory cells. Each memory block may be connected to the row decoder circuit 113 through at least one string selection line SSL, a plurality of word lines WL, and at least one ground selection line GSL. Each memory block may be connected to the page buffer circuit 115 through a plurality of bit lines BL. The memory blocks BLK1 through BLKz may be connected in common to the plurality of bit lines BL. Memory cells in the memory blocks BLK1 through BLKz may have the same structure.

In an exemplary embodiment of the inventive concept, each of the memory blocks BLK1 through BLKz may be a unit of an erase operation. An erase operation may be carried out by a memory block. Memory cells in a memory block may be erased at the same time. In an exemplary embodiment of the inventive concept, each memory block may be divided into a plurality of sub-blocks. Erasing may be made by a sub-block.

In an exemplary embodiment of the inventive concept, each of the memory blocks BLK1 to BLKz may include a physical storage space which is distinguished by a block address. Each of the word lines WL may correspond to a physical storage space which is distinguished by a row address. Each of the bit lines BL may correspond to a physical storage space which is distinguished by a column address.

The row decoder circuit 113 may be connected to the memory cell array 111 through a plurality of ground selection lines GSL, the plurality of word lines WL, and a plurality of string selection lines SSL. The row decoder circuit 113 may operate according to a control of the control logic circuit 119. The row decoder circuit 113 may decode an address received from a controller 120 through an input/output channel and may control voltages to be applied to the string selection lines SSL, the word lines WL, and the ground selection lines GSL based on the decoded address.

For example, at a programming, the row decoder circuit 113 may apply a program voltage to a selected word line in a memory block selected by an address. The row decoder circuit 113 may also apply a pass voltage to unselected word lines in the selected memory block. At a reading, the row decoder circuit 113 may apply a selection read voltage to the selected word line in the selected memory block. The row decoder circuit 113 may also apply a non-selection read voltage to unselected word lines in the selected memory block. At an erasing, the row decoder circuit 113 may apply an erase voltage (e.g., a ground voltage or a low voltage of which the level is similar to that of the ground voltage) to word lines in the selected memory block.

The page buffer circuit 115 may be connected to the memory cell array 111 through the bit lines BL. The page buffer circuit 115 may be connected to the memory cell array 117 through the bit lines BL. The page buffer circuit 115 may operate under a control of the control logic circuit 119.

During programming, the page buffer circuit 115 may store data to be programmed in memory cells. The page buffer circuit 115 may apply voltages to the bit lines BL based on the stored data. The page buffer circuit 115 may function as a write driver. During reading, the page buffer circuit 115 may sense voltages on the bit lines BL and may store the sensed results. The page buffer circuit 115 may function as a sense amplifier.

The data input/output circuit 117 may be connected to the page buffer circuit 115 through data lines DL. The data input/output circuit 117 may output data, which is read by the page buffer circuit 115, to the controller 120 through the input/output channel and may transfer data, which is received from the controller 120 through the input/output channel, to the page buffer circuit 115.

The control logic circuit 119 may receive a command from the controller 120 through the input/output channel and may receive a control signal from the controller 120 through a control channel. The control logic circuit 119 may receive a command, which is received through the input/output channel, in response to the control signal, may route an address, which is received through the input/output channel, to the row decoder circuit 113, and may route data, which is received through the input/output channel, to the data input/output circuit 117. The control logic circuit 119 may decode the received command and may control the nonvolatile memory device 110 based on the decoded command.

In exemplary embodiments of the inventive concept, the control logic circuit 119 may generate a data strobe signal DQS based on a read enable signal /RE received from the controller 120 through the input/output channel. The data strobe signal DQS thus generated may be outputted to the controller 120 through the control channel. At a writing, the control logic circuit 119 may receive the data strobe signal DQS from the controller 120 through the control channel.

Figure 21:
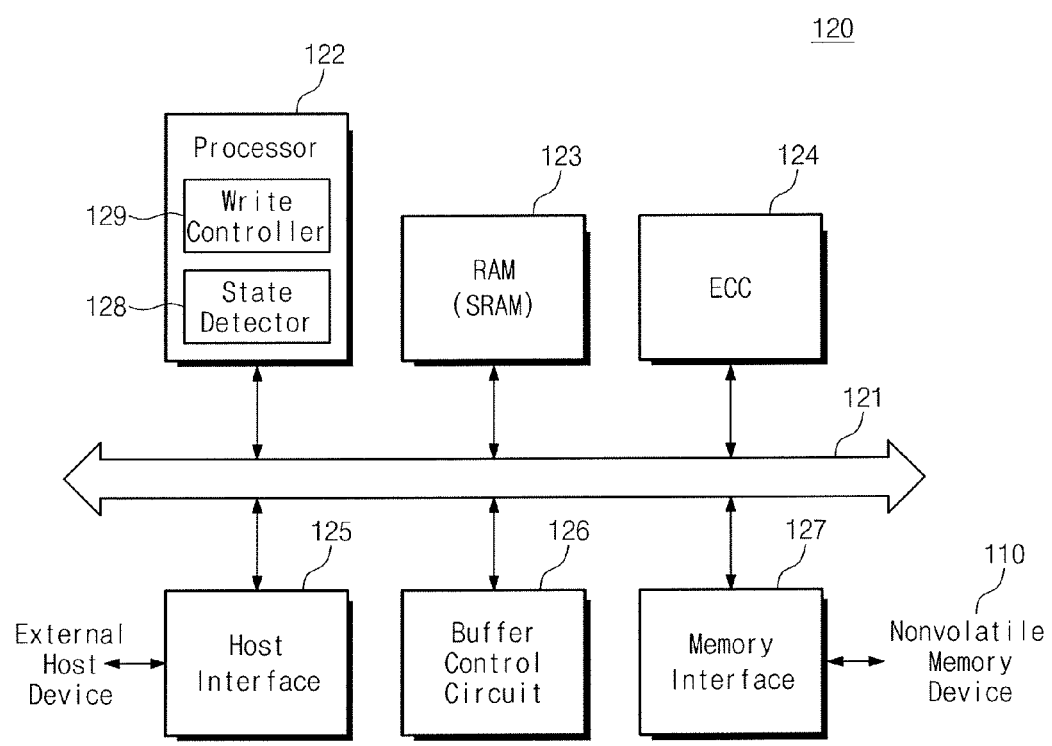
FIG. 21 is a block diagram illustrating a controller according to an exemplary embodiment of the inventive concept.

FIG. 21 is a block diagram illustrating a controller 120 according to an exemplary embodiment of the inventive concept. Referring to FIGS. 1 and 21, the controller 120 may include a bus 121, a processor 122, a RAM 123, an error-correcting code (ECC) block 124, a host interface 125, a buffer control circuit 126, and a memory interface 127.

The bus 121 may be configured to provide a channel among components of the controller 120.

The processor 122 may control an overall operation of the controller 120 and may execute a logical operation. The processor 122 may communicate with an external host device through the host interface 125, may communicate with the nonvolatile memory device 110 through the memory interface 127, and may communicate with the RAM 123 through the buffer control circuit 126. The processor 122 may control the storage device 100 using the RAM 123 as a working memory, a cache memory, or a buffer memory.

The processor 122 may include a state detector 128 and a write controller 129 according to an exemplary embodiment of the inventive concept. The state detector 128 or the write controller 129 may be implemented with hardware of the processor 122, software driven by the processor 122, or a combination of software and hardware.

The RAM 123 may be used as a working memory, a cache memory, or a buffer memory of the processor 122. The RAM 123 may store codes or commands executable by the processor 122. The RAM 123 may store data processed by the processor 122. The RAM 123 may include an SRAM.

The ECC block 124 may perform an error correction operation. The ECC block 124 may perform error correction encoding based on data to be written to the nonvolatile memory 110 through the memory interface 127. The error correction encoded data may be transferred to the nonvolatile memory device 110 through the memory interface 127. The ECC block 124 may perform error correction decoding on data received through the memory interface 127 from the nonvolatile memory device 110. In an exemplary embodiment of the inventive concept, the ECC block 124 may be included in the memory interface 127 as a component of the memory interface 127.

The host interface 125 may communicate with the external host device under control of the processor 122. The host interface 125 may communicate using at least one of various communication techniques, such as a USB, a serial advanced technology attachment (SATA), a high speed interchip (HSIC), a small computer system interface (SCSI), Firewire, a peripheral component interconnection (PCI), a PCI express (PCIe), a nonvolatile memory express (NVMe), a UFS, an SD, an MMC, an eMMC, a dual in-line memory module (DIMM), a registered DIMM (RDIMM), a load reduced DIMM (LRDIMM), and the like.

The buffer control circuit 126 may control the RAM 130 under control of the processor 122.

The memory interface 127 may communicate with the nonvolatile memory 110 under control of the processor 122. As described with reference to FIG. 1, the memory interface 127 may convey a command, an address, and data to the nonvolatile memory device 110 through the input/output channel. The memory interface 127 may convey a control signal to the nonvolatile memory device 110 through the control channel.

In an exemplary embodiment of the inventive concept, in the case where the storage device 100 does not include the RAM 130, the controller 120 may not include the buffer control circuit 126.

In an exemplary embodiment of the inventive concept, the processor 122 may control the controller 120 using codes. The processor 122 may load codes from a nonvolatile memory (e.g., a read only memory) that is implemented in the controller 120. The processor 122 may also load codes from the nonvolatile memory device 110 through the memory interface 127.

In an exemplary embodiment of the inventive concept, the bus 121 of the controller 120 may be divided into a control bus and a data bus. In an exemplary embodiment of the inventive concept, the data bus may transfer data in the controller 120, and the control bus may transfer control information such as a command and an address to the controller 120. The data bus and the control bus may be independent of each other to prevent mutual interference or influence. The data bus may be connected with the ECC block 124, the host interface 125, the buffer control circuit 126, and the memory interface 127. The control bus may be connected with the processor 122, the RAM 123, the host interface 125, the buffer control circuit 126, and the memory interface 127.

Figure 22:
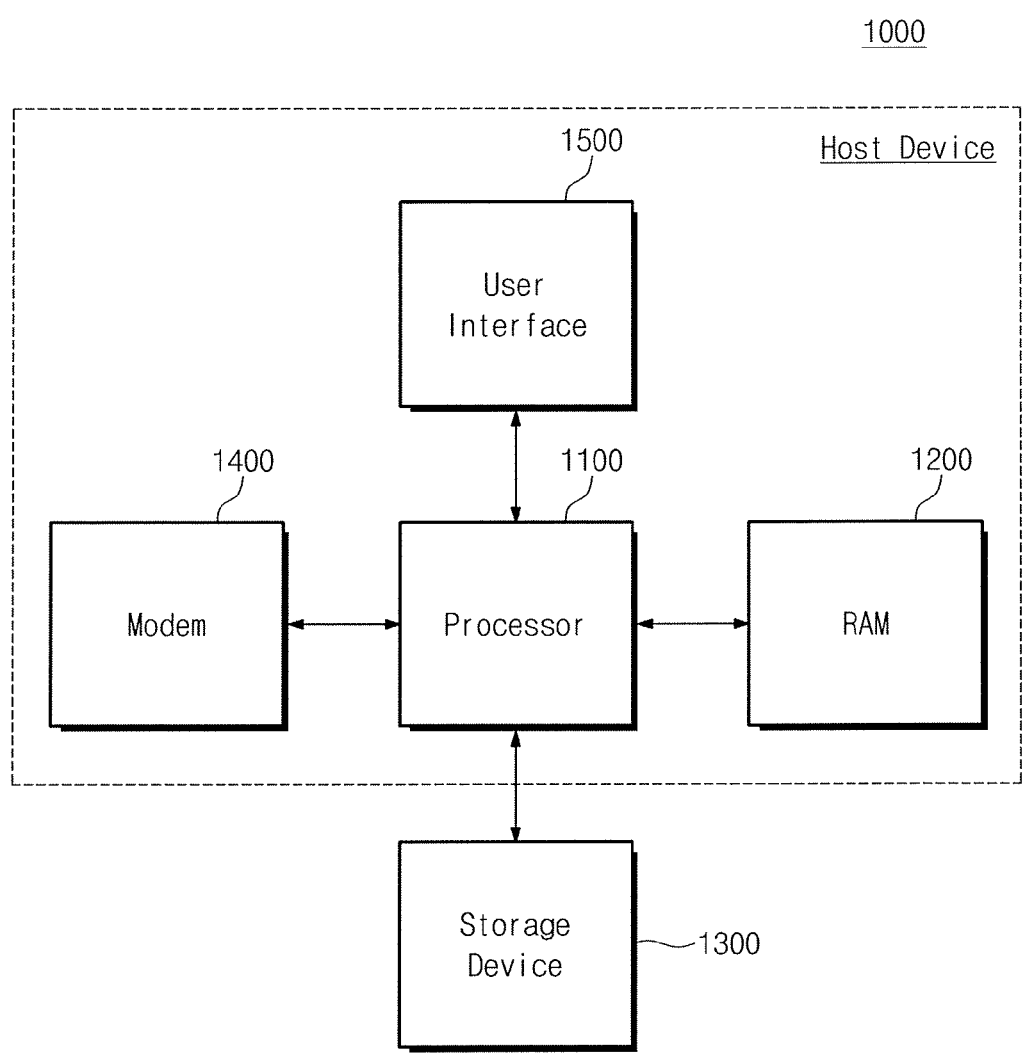
FIG. 22 is a block diagram illustrating a computing device according to an exemplary embodiment of the inventive concept.

FIG. 22 is a block diagram illustrating a computing device 1000 according to an exemplary embodiment of the inventive concept. Referring to FIG. 22, the computing device 1000 may include a processor 1100, a RAM 1200, a storage device 1300, a modem 1400, and a user interface 1500.

The processor 1100 may control an overall operation of the computing device 100 and may perform a logic operation. The processor 1100 may be a data processing device which is based on hardware including a circuit physically configured to execute operations expressed by commands included in a code or program. For example, the processor 1100 may be a system-on-chip (SoC). The processor 1100 may be a general purpose processor, a specific-purpose processor, or an application processor.

The RAM 1200 may communicate with the processor 1100. The RAM 1200 may be a main memory of the processor 1100 or the computing device 1000. The processor 1100 may store codes or data in the RAM 1200 temporarily. The processor 1100 may execute codes using the RAM 1200 and may process data. The processor 1100 may execute a variety of software, such as, but not limited to, an operating system and an application, using the RAM 1200. The processor 1100 may control an overall operation of the computing device 1000 using the RAM 1200. The RAM 1200 may include a volatile memory such as, but not limited to, an SRAM, a DRAM, an SDRAM, and the like or a nonvolatile memory such as, but not limited to, a PRAM, an MRAM, an RRAM, an FRAM, and the like.

The storage device 1300 may communicate with the processor 1100. The storage device 1300 may be used to store data for a long time. In other words, the processor 1100 may store data, which is to be stored for a long time, in the storage device 1300. The storage device 1300 may store a boot image for driving the computing device 1000. The storage device 1300 may store source codes of a variety of software, such as an operating system and an application. The storage device 1300 may store data that is processed by a variety of software, such as an operating system and an application.

In an exemplary embodiment of the inventive concept, the processor 1100 may load source codes stored in the storage device 1300 onto the RAM 1200 and may execute the codes, thereby driving a variety of software, such as operating system, application, and the like. The processor 1100 may load data stored in the storage device 1300 onto the RAM 1200 and may process data loaded onto the RAM 1200. The processor 1100 may store long-term data among data, stored in the RAM 1200, in the storage device 1300.

The storage device 1300 may include a nonvolatile memory, such as, but not limited to, a flash memory, a PRAM, an MRAM, an RRAM, an FRAM, and the like.

The modem 1400 may communicate with an external device under a control of the processor 1100. For example, the modem 1400 may communicate with the external device in a wired or wireless manner. The modem 1400 may communicate with the external device, based on at least one of wireless communications techniques such as long term evolution (LTE), worldwide interoperability for microwave access (WiMax), global system for mobile communication (GSM), code division multiple access (CDMA), Bluetooth, near field communication (NFC), Wi-Fi, radio frequency identification (RFID), and the like or wired communications techniques such as USB, SATA, HSIC, SCSI, Firewire, PCI, PCIe, NVMe, UFS, SD, SDIO, universal asynchronous receiver transmitter (UART), serial peripheral interface (SPI), high speed SPI (HS-SPI), RS232, inter-integrated circuit (I2C), HS-I2C, integrated-interchip sound (I2S), Sony/Philips digital interface (S/PDIF), MMC, eMMC, and so on.

The user interface 1500 may communicate with a user under control of the processor 1100. For example, the user interface 1500 may include user input interfaces such as a keyboard, a keypad, buttons, a touch panel, a touch screen, a touch pad, a touch ball, a camera, a microphone, a gyroscope sensor, a vibration sensor, and the like. The user interface 150 may further include user output interfaces such as a liquid crystal display (LCD), an organic light-emitting diode (OLED) display device, an active matrix OLED (AMOLED) display device, a light-emitting diode (LED), a speaker, a motor, and the like.

The storage device 1300 may include the storage device 100 according to an exemplary embodiment of the inventive concept. The processor 1100, RAM 1200, modem 1400, and user interface 1500 may constitute a host device that communicates with the storage device 1300.

According to an exemplary embodiment of the inventive concept, data may be written to two or more pages through a common write operation and an individual write operation. The stress to memory cells due to the common write operation may be reduced, and thus, a storage device with an increased reliability and an operating method thereof may be provided.

While the inventive concept has been described with reference to exemplary embodiments thereof, it will be apparent to those skilled in the art that various changes and modifications may be made thereto without departing from the spirit and scope of the inventive concept.

What is claimed is:

1. A storage device, comprising:
a nonvolatile memory device comprising a plurality of memory cells, the memory cells divided into a plurality of pages; and
a controller configured to control the nonvolatile memory device,
wherein the storage device is configured to collect two or more write data groups to be written to two or more pages, respectively, to simultaneously perform a common write operation with the two or more pages, and then, to sequentially perform an individual write operation with respect to each of the two or more pages,
wherein, in each of the two or more pages:
memory cells connected to the same bit line and the same word line are programmed to a same program state in the common write operation and,
program states of first memory cells connected to the same bit line and the same word line are maintained and second memory cells connected to the same bit line and the same word line are programmed to different program states in the individual write operations.

2. The storage device of claim 1, wherein memory cells which are disposed between a string selection line and a ground selection line, are connected in common to a word line, and correspond to a plurality of bit lines constitute a page.

3. The storage device of claim 1, wherein the controller is configured to detect a common data group from the two or more write data groups and to perform the common write operation based on the detected common data group, and
wherein the common data group includes data, which corresponds to respective bit lines and corresponds to a lowest voltage distribution range, from among the two or more write data groups.

4. The storage device of claim 3, wherein the controller transmits the detected common data group to the nonvolatile memory device and controls the nonvolatile memory device such that the detected common data group is simultaneously written to the two or more pages.

5. The storage device of claim 3, wherein the nonvolatile memory device is configured to perform the common write operation by performing a program loop plural times with the two or more pages, and
wherein the program loop comprises a program operation in which a program voltage is applied to the two or more pages and a verification operation in which a verification voltage is applied to the two or more pages.

6. The storage device of claim 5, wherein the nonvolatile memory device is configured to perform the program operation simultaneously with the two or more pages, and
wherein the nonvolatile memory device is configured to perform the verification operation simultaneously with the two or more pages.

7. The storage device of claim 5, wherein the nonvolatile memory device is configured to perform the program operation simultaneously with the two or more pages, and
wherein the nonvolatile memory device is configured to perform the verification operation sequentially with the two or more pages.

8. The storage device of claim 5, wherein the nonvolatile memory device is configured to reduce a level of the verification voltage to be lower than a predetermined value during the common write operation.

9. The storage device of claim 5, wherein the nonvolatile memory device is configured to increase the program voltage to be lower than a predetermined value when the program loop is repeated, during the common write operation.

10. The storage device of claim 5, wherein the nonvolatile memory device is configured to complete the common write operation when a result of the verification operation indicates a pass and to complete the common write operation if the program loop is performed a predetermined number of times.

11. The storage device of claim 3, wherein when the lowest voltage distribution range is higher than a reference voltage distribution range, the controller is configured to detect, as the common data group, data corresponding to the reference voltage distribution range.

12. The storage device of claim 1, wherein the memory cells are included in a plurality of cell strings arranged on a substrate, and
wherein each of the cell strings comprises a ground selection transistor, memory cells, and a string selection transistor stacked in a direction perpendicular to the substrate.

13. The storage device of claim 12, wherein memory cells which are disposed between a string selection line and a ground selection line, are connected in common to a word line, correspond to a plurality of bit lines, and are disposed at a same height from the substrate constitute a page.

14. The storage device of claim 13, wherein the two or more pages are disposed at a same height from the substrate.

15. The storage device of claim 13, wherein the two or more pages are disposed at different heights from the substrate.

16. The storage device of claim 13, wherein the controller performs the common write operation with respect to first pages among pages disposed at a same height from the substrate and controls the nonvolatile memory device such that the individual write operation is performed with respect to each of the first pages, and
wherein the controller performs the common write operation with respect to second pages among pages disposed at the same height from the substrate and controls the nonvolatile memory device such that the individual write operation is performed with respect to each of the second pages.

17. The storage device of claim 1, wherein during the individual write operation, the controller transmits a first write data group among the two or more write data groups to the nonvolatile memory device, controls the nonvolatile memory device such that the first write data group is written to a first page among the two or more pages, transmits a second write data group among the two or more write data groups to the nonvolatile memory device, and controls the nonvolatile memory device such that the second write data group is written to a second page among the two or more pages.

18. The storage device of claim 1, further comprising:
a random access memory, and
wherein the controller is configured to collect the two or more write data groups in the random access memory.

19. A storage device, comprising:
a random access memory;
a nonvolatile memory device comprising a plurality of cell strings arranged on a substrate, each of the cell strings comprising a ground selection transistor, memory cells, and a string selection transistor stacked in a direction perpendicular to the substrate; and
a controller configured to simultaneously perform a common write operation with a plurality of pages of the nonvolatile memory device using data collected on the random access memory and then, control the nonvolatile memory device such that an individual write operation is sequentially performed with each of the plurality of pages, and
wherein in the nonvolatile memory device, memory cells which are disposed between a string selection line and a ground selection line, are connected in common to a word line, correspond to a plurality of bit lines, and are disposed at a same height from the substrate constitute a page, wherein, in the common write operation, first and second memory cells of a first page are programmed to first and second states, respectively, and third and fourth memory cells of a second page are programmed to the first and second states, respectively, wherein, in the individual write operations, the first and second memory cells are maintained at the first and second states, respectively, and the third and fourth memory cells are programmed to third and fourth states, respectively.

20. An operating method of a storage device which comprises a nonvolatile memory device and a controller configured to control the nonvolatile memory device, the method comprising:

collecting a first data group and a second data group, by the controller;

transmitting to the nonvolatile memory device a third data group generated from the first data group and the second data group, by the controller;

simultaneously performing a common write operation with first and second pages using the third data group, by the nonvolatile memory device;

transmitting the first data group to the nonvolatile memory device, by the controller;

performing an individual write operation with the first page using the first data group, by the nonvolatile memory device, wherein the individual write operation with the first page is performed after the common write operation with the first page;

transmitting the second data group to the nonvolatile memory device, by the controller; and performing an individual write operation with the second page using the second data group, by the nonvolatile memory device, wherein, in each of the first page and the second page;

memory cells connected to the same bit line are programmed to a same program state in the common write operation and, first memory cells connected to the same bit line are not programmed again and second memory cells connected to the same bit line are programmed to different program states in the individual write operations.

* * * * *